United States Patent
Horiba et al.

(10) Patent No.: US 8,217,391 B2
(45) Date of Patent: Jul. 10, 2012

(54) ORGANIC SEMICONDUCTOR TRANSISTOR, METHOD OF PRODUCING THE SAME, AND ELECTRONIC DEVICE

(75) Inventors: Koji Horiba, Kanagawa (JP); Hidekazu Hirose, Kanagawa (JP); Akira Imai, Kanagawa (JP); Takeshi Agata, Kanagawa (JP); Katsuhiro Sato, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 397 days.

(21) Appl. No.: 12/558,904

(22) Filed: Sep. 14, 2009

(65) Prior Publication Data

US 2010/0243995 A1    Sep. 30, 2010

(30) Foreign Application Priority Data

Mar. 24, 2009   (JP) ................. 2009-072222

(51) Int. Cl.
*H01L 35/24* (2006.01)
(52) U.S. Cl. .................. 257/40; 257/E51.001; 548/146; 548/206
(58) Field of Classification Search .................. 257/40, 257/E51.001; 548/146, 206
See application file for complete search history.

(56) References Cited

U.S. PATENT DOCUMENTS

| | | |
|---|---|---|
| 5,574,291 A | 11/1996 | Dodabalapur et al. |
| 5,596,208 A | 1/1997 | Dodabalapur et al. |
| 5,659,181 A | 8/1997 | Bridenbaugh et al. |
| 5,946,551 A | 8/1999 | Dimitrakopoulos et al. |

(Continued)

FOREIGN PATENT DOCUMENTS

JP    A-05-055568    3/1993

(Continued)

OTHER PUBLICATIONS

Mamada et al, "Preparation, Characterization, and Field-effect Transistor Performance of Benzo[1,2-d:4,5-d']bisthiazole Derivatives," Chemistry Letters, vol. 37, No. 7, 2008, pp. 766-767.*

(Continued)

*Primary Examiner* — Anthony Ho
(74) *Attorney, Agent, or Firm* — Oliff & Berridge, PLC

(57) ABSTRACT

An organic semiconductor transistor has plural electrodes and an organic semiconductor layer containing at least one compound represented by the following Formula (I). In Formula (I), each $R^1$ independently represents a straight-chain alkyl group having from 3 to 20 carbon atoms, a straight-chain alkoxy group having from 3 to 20 carbon atoms, a branched alkyl group having from 3 to 20 carbon atoms, or a branched alkoxy group having from 3 to 20 carbon atom, and each $R^2$ independently represents a hydrogen atom, a straight-chain alkyl group having from 1 to 20 carbon atoms, a straight-chain alkoxy group having from 1 to 20 carbon atoms, a branched alkyl group having from 3 to 20 carbon atoms, or a branched alkoxy group having from 3 to 20 carbon atoms.

(I)

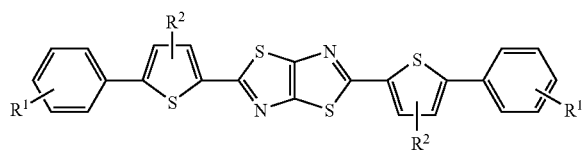

20 Claims, 2 Drawing Sheets

U.S. PATENT DOCUMENTS

| | | | |
|---|---|---|---|
| 5,981,970 A | 11/1999 | Dimitrakopoulos et al. | |
| 6,107,117 A | 8/2000 | Bao et al. | |

FOREIGN PATENT DOCUMENTS

| | | |
|---|---|---|
| JP | A-05-190877 | 7/1993 |
| JP | A-08-228034 | 9/1996 |
| JP | A-08-228035 | 9/1996 |
| JP | A-08-264805 | 10/1996 |
| JP | A-10-125924 | 5/1998 |
| JP | A-10-190001 | 7/1998 |
| JP | A-10-270712 | 10/1998 |
| JP | A-2000-174277 | 6/2000 |
| JP | A-2001-094107 | 4/2001 |
| JP | A-2006-206503 | 8/2006 |

OTHER PUBLICATIONS

Kumaki et al, "Significant improvement of electron mobility in organic thin-film transistors based on thiazolothiazole derivative by employing self-assembled monolayer," Applied Physics Letters, 90, 053506, 2007, pp. 053506-1-053506-3.*

Drury et al., "Low-cost all-polymer integrated circuits," *Applied Physics Letters*, 1998, vol. 73, No. 1, pp. 108-110.

Ando et al., "Synthesis, physical properties, and field-effect transistors of novel thiophene/thiazolothiazole co-oligomers," *J. Mater. Chem.*, 2004, vol. 14, pp. 1787-1790.

Ando et al., "Characterization and Field-Effect Transistor Performance of Heterocyclic Oligomers Containing a Thiazolothiazole Unit," *Chemistry Letters*, 2004, vol. 33, No. 9, pp. 1170-1171.

Johnson et al., "Thiazolothiazoles. II. Parent heterocycle and its carboxylic and amino derivatives," *J. Am. Chem. Soc.*, 1970, Vo. 92, No. 13, pp. 4046-4050.

Ando et al., "High Performance n-Type Organic Field-Effect Transistors Based on π-Electronic Systems with Trifluoromethylphenyl Groups," *J. Am. Chem. Soc.*, 2005, vol. 127, pp. 5336-5337.

Japanese Office Action in Japanese Patent Application No. 2009-072222; dated Aug. 23, 2011 (with English-language translation).

* cited by examiner

ORGANIC SEMICONDUCTOR TRANSISTOR, METHOD OF PRODUCING THE SAME, AND ELECTRONIC DEVICE

CROSS REFERENCE TO RELATED APPLICATIONS

This application is based on and claims priority under 35 USC 119 from Japanese Patent Application No. 2009-072222, filed on Mar. 24, 2009.

BACKGROUND

1. Technical Field

The present invention relates to an organic semiconductor transistor, a method of producing the organic semiconductor transistor, and an electronic device.

2. Related Art

A thin film transistor is widely used as a switching element for display devices such as liquid crystal displays. Conventionally, the thin film transistor is produced by using amorphous or polycrystalline silicon.

Meanwhile, organic semiconductors typified by organic EL devices or the like have been studied extensively in recent years. At the same time, organic materials have been reported to be incorporated in electronic circuits in place of silicon material, owing to their advantages of light weight and flexibility.

SUMMARY

According to an aspect of the invention, there is provided an organic semiconductor transistor having plural electrodes and an organic semiconductor layer that contains at least one compound represented by the following Formula (I).

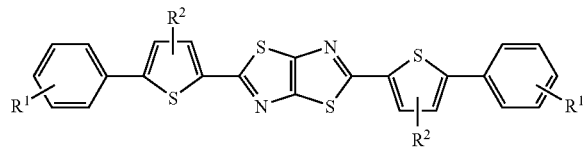

(I)

In Formula (I), each $R^1$ independently represents a straight-chain alkyl group having from 3 to 20 carbon atoms, a straight-chain alkoxy group having from 3 to 20 carbon atoms, a branched alkyl group having from 3 to 20 carbon atoms, or a branched alkoxy group having from 3 to 20 carbon atoms; and each $R^2$ independently represents a hydrogen atom, a straight-chain alkyl group having from 1 to 20 carbon atoms, a straight-chain alkoxy group having from 1 to 20 carbon atoms, a branched alkyl group having 3 to 20 carbon atoms, or a branched alkoxy group having from 3 to 20 carbon atoms.

BRIEF DESCRIPTION OF THE DRAWINGS

Exemplary embodiments of the present invention will be described in detail based on the following figures, wherein.

DETAILED DESCRIPTION

Figure 1:
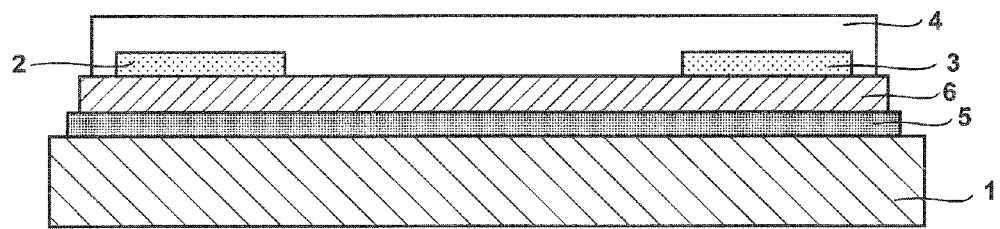
FIG. 1 is a schematic diagram showing an example of a layered configuration of an organic semiconductor transistor in an exemplary embodiment of the present invention.

Hereinafter, the exemplary embodiments of the present invention will be described in detail. Further, the present invention is in no way limited by the action or function deduced from the present description.

The organic semiconductor transistor of the exemplary embodiments of the present invention has plural electrodes and an organic semiconductor layer that contains at least one compound represented by the following Formula (I). The compound represented by the Formula (I) is described at first, and then the organic semiconductor transistor of the exemplary embodiments will be described.

<Compound Represented by Formula (I)>

The compound represented by Formula (I) is a thiazolothiazole derivative. Hereinafter, the compound represented by Formula (I) is called as the thiazolothiazole derivative in some cases.

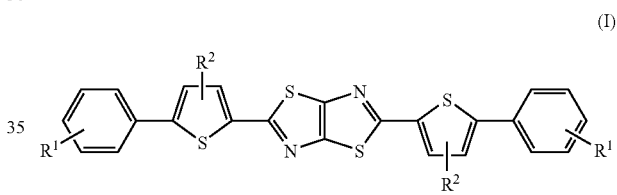

(I)

In the Formula (I), each $R^3$ independently represents a straight-chain alkyl group having from 3 to 20 carbon atoms, a straight-chain alkoxy group having from 3 to 20 carbon atoms, a branched alkyl group having from 3 to 20 carbon atoms, or a branched alkoxy group having from 3 to 20 carbon atoms; and each $R^2$ independently represents a hydrogen atom, a straight-chain alkyl group having from 1 to 20 carbon atoms, a straight-chain alkoxy group having from 1 to 20 carbon atoms, a branched alkyl group having 3 to 20 carbon atoms, or a branched alkoxy group having from 3 to 20 carbon atoms.

Among these, preferably, $R^1$ in the Formula (I) is a straight-chain substitution group having from 3 to 12 carbon atoms or a branched substitution group having from 3 to 12 carbon atoms in the main chain thereof and $R^2$ is a straight-chain substitution group having from 1 to 12 carbon atoms or a branched substitution group having from 2 to 12 carbon atoms in the main chain thereof.

The straight-chain substitution group having from 3 to 12 carbon atoms may include a straight-chain alkyl group having from 3 to 12 carbon atoms and a straight-chain alkoxy group having from 3 to 12 carbon atoms. The branched substitution group having from 3 to 20 carbon atoms in the main chain thereof may include a branched alkyl group having from 3 to 20 carbon atoms and a branched alkoxy group having from 3 to 20 carbon atom, in which the straight main chain portion thereof except the branched group portion of the alkyl group or alkoxy group has from 2 to 12 carbon atoms.

It is thought that the thiazolothiazole derivative represented by Formula (I) exerts an excellent charge mobility owing to conjugated π-electrons spreading over the aromatic rings thereof which have a high planarity in terms of molecular structure.

The solubility of the thiazolothiazole derivative represented by Formula (I) is increased by selecting a phenyl group for the substitution groups adjacent to the thiophene rings. This is presumably because the bond between the end phenyl substitution group and the thiophene ring rotates freely. Further, by incorporating an alkyl or an alkoxy group into $R^1$, hydrophobic interaction with an organic solvent is increased, whereby the solubility in the organic solvent is thought to be increased. Still further, by incorporating an alkyl group or an alkoxy group into $R^2$, hydrophobic interaction with an organic solvent is increased, whereby solubility is thought to be greatly increased. In addition, an effect of reducing ionization potential is exhibited. Also, presumably by incorporating an alkyl group or an alkoxy group as the substitution group of the phenyl group, the molecular weight is increased, thereby exhibiting adequate heat resistance.

In particular, in the thiazolothiazole derivative represented by Formula (I), by selecting the length of the substitution groups $R^1$ and $R^2$ to be 20 or less in terms of the carbon atom number of an alkyl or alkoxy group, preferably 12 or less, and, in the case of $R^2$, more preferably 8 or less, the substitution groups are presumably prevented from being tangled with each other, thereby increasing the solubility.

Further, the exemplary embodiments of the present invention are in no way limited by the presumptions described above.

On the other hand, a thiazolothiazole derivative that is not the thiazolothiazole derivative represented by Formula (I) and is represented by the following Chemical Formula 3 is obtained in the form of crystals; however, this thiazolothiazole derivative is not easily dissolved in an organic solvent, whereby crystals are precipitated when a coating liquid is prepared and the coating liquid lacks temporal stability. The derivative represented by Chemical Formula 3 is difficult to use. While unevenness is developed in the thickness of a film that is prepared by using the thiazolothiazole derivative represented by Chemical Formula 3, the unevenness accompanied by coating is prevented when the thiazolothiazole derivative represented by Formula (I) is used.

Chemical Formula 3

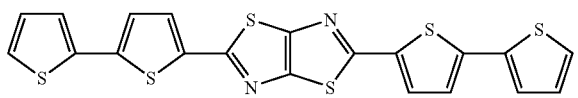

Hereinafter, the thiazolothiazole derivative represented by Formula (I) will be described in detail.

The linking position of $R^1$ on the phenyl group is preferably position-3 or 4, and more preferably position-4.

Specific examples of the straight-chain alkyl group having from 3 to 20 carbon atoms in $R^1$ may include: propyl, butyl, hexyl, octyl, decyl, dodecyl, tetradecyl, hexadecyl, octadecyl, and icosyl; and preferably a straight chain alkyl group having from 3 to 12 carbon atoms including specifically propyl, butyl, hexyl, octyl, decyl, and dodecyl, preferably butyl, hexyl, n-octyl, and dodecyl.

Specific examples of the straight-chain alkoxy group having from 3 to 20 carbon atoms in $R^1$ may include: methoxy, ethoxy, propoxy, butoxy, hexyloxy, octyloxy, decyloxy, dodecyloxy, tetradecyloxy, hexadecyloxy, octadecyloxy, and icosyloxy; and preferably a straight-chain alkoxy group having from 3 to 12 carbon atoms including specifically propoxy, butoxy, hexyloxy, octoxy, octyloxy, decyloxy, and dodecyloxy, preferably butoxy, hexyloxy, octoxy, and dodecyloxy.

Specific examples of the branched alkyl group having from 3 to 20 carbon atoms in $R^1$ may include: isopropyl, isobutyl, sec-butyl, tert-butyl, isopentyl, tert-pentyl, 1-methylpentyl, 4-methylpentyl, 3,3-dimethylbutyl, 2-ethylbutyl, 1-methylhexyl, tert-octyl, 1-methylheptyl, 2-ethylhexyl, 2-propylpentyl, 2,2-dimethylhexyl, 2-methyloctyl, 2,2-dimethylheptyl, 2,2-dimethyloctyl, 2,3-dimethyloctyl, 2,6-dimethyl-4-heptyl, 3,5,5-trimethylhexyl, 1-methyldecyl, 2-methyldecyl, 2,2-dimethyldecyl, 2,3-dimethyldecyl, 2,2-diethyldecyl, 1-hexylheptyl, 1-methylhexadecyl, and 1,1-dimethylhexadecyl; and preferably a branched alkyl group having from 3 to 12 carbon atoms including specifically isopropyl, tea-butyl, 2-methylhexyl, 2,2-dimethylhexyl, 2-methyloctyl, 2,2-dimethyloctyl, 2,3-dimethyloctyl, 2-methyldecyl, 2,2-dimethyldecyl, and 2,3-dimethyldecyl, preferably tert-butyl, 2,2-dimethylhexyl, 2-methyloctyl, 2,2-dimethyloctyl, 2,3-dimethyloctyl, and 2,2-dimethyldecyl.

Specific examples of the branched alkoxy group having from 3 to 20 carbon atoms in $R^1$ may include: isopropoxy, isobutoxy, sec-butoxy, tert-butoxy, 3,3-dimethylbutyloxy, 2-ethylbutyloxy, 2-methylhexyloxy, 2,2-dimethylhexyloxy, 2-methyloctyloxy, 2,2-dimethyloctyloxy, 2,3-dimethyloctyloxy, 2-methyldecyloxy, 2,2-dimethyldecyloxy, 2,3-dimethyldecyloxy, 2-methyldodecyl, 2-methyltetradecyl, 2-methylhexadecyl, and 2-methyloctadecyl; preferably a branched alkoxy group having from 3 to 12 carbon atoms including specifically isopropoxy, tert-butoxy, 2-methylhexyloxy, 2,2-dimethylhexyloxy, 2-methyloctyloxy, 2,2-dimethyloctyloxy, 2,3-dimethyloctyloxy, 2-methyldecyloxy, 2,2-dimethyldecyloxy, and 2,3-dimethyldecyloxy; and more preferably tert-butoxy, 2-methyloctyloxy, 2,2-dimethyloctyloxy, and 2,3-dimethyldecyloxy.

Specific examples of the straight-chain alkyl group having from 1 to 20 carbon atoms in $R^2$ may include: methyl, ethyl, propyl, butyl, hexyl, octyl, decyl, dodecyl, tetradecyl, hexadecyl, octadecyl, and icosyl; preferably a straight-chain alkyl group having from 1 to 8 carbon atoms including specifically methyl, ethyl, propyl, butyl, hexyl, and octyl, more preferably methyl, butyl, hexyl, and octyl; and still more preferably a straight-chain alkyl group having from 3 to 8 carbon atoms including propyl, butyl, hexyl, and octyl.

Specific examples of the straight-chain alkoxy group having from 1 to 20 carbon atoms in $R^2$ may include: methoxy, ethoxy, propoxy, butoxy, hexyloxy, octyloxy, decyloxy, dodecyloxy, tetradecyloxy, hexadecyloxy, octadecyloxy, and icosyloxy; preferably a straight-chain alkoxy group having from 1 to 8 carbon atoms including specifically methoxy, ethoxy, propoxy, butoxy, hexyloxy, and octyloxy, more preferably methoxy, butoxy, and hexyloxy; and still more preferably a straight-chain alkoxy group having from 3 to 8 carbon atoms including butoxy and hexyloxy.

Specific examples of the branched alkyl group having from 1 to 20 carbon atoms in $R^2$ may include: isopropyl, isobutyl, sec-butyl, tert-butyl, isopentyl, tert-pentyl, 1-methylpentyl, 4-methylpentyl, 3,3-dimethylbutyl, 2-ethylbutyl, 1-methylhexyl, tert-octyl, 1-methylheptyl, 2-ethylhexyl, 2-propylpentyl, 2,2-dimethylhexyl, 2-methyloctyl, 2,2-dimethylheptyl, 2,2-dimethyloctyl, 2,3-dimethyloctyl, 2,6-dimethyl-4-heptyl, 3,5,5-trimethylhexyl, 1-methyldecyl, 2-methyldecyl, 2,2-dimethyldecyl, 2,3-dimethyldecyl, 2,2-diethyldecyl, 1-hexylheptyl, 1-methylhexadecyl, and 1,1-dimethylhexadecyl; preferably a branched alkyl group having from 3 to 12 carbon atoms including specifically isopropyl, tert-butyl, 2-methylhexyl, 2,2-dimethylhexyl, 2-methyloctyl, 2,2-dimethyloctyl, 2,3-dimethyloctyl, 2-methyldecyl, 2,2-dimethyldecyl, and 2,3-dimethyldecyl, preferably tert-butyl, 2,2-dimethylhexyl, 2-methyloctyl, 2,2-dimethyloctyl, 2,3-dimethyloctyl, and 2,2-dimethyldecyl; and still more preferably a branched alkyl group having from 3 to 8 carbon atoms including tert-butyl and 2,2-dimethylhexyl.

Specific examples of the branched alkoxy group having from 1 to 20 carbon atoms in $R^2$ may include: isopropoxy, isobutoxy, sec-butoxy, tert-butoxy, 3,3-dimethylbutyloxy, 2-ethylbutyloxy, 2-methylhexyloxy, 2,2-dimethylhexyloxy, 2-methyloctyloxy, 2,2-dimethyloctyloxy, 2,3-dimethyloctyloxy, 2-methyldecyloxy, 2,2-dimethyldecyloxy, 2,3-dimethyldecyloxy, 2-methyldodecyl, 2-methyltetradecyl, 2-methylhexadecyl, and 2-methyloctadecyl; preferably a branched alkoxy group having from 3 to 12 carbon atoms including specifically isopropoxy, tert-butoxy, 2-methylhexyloxy, 2,2-dimethylhexyloxy, 2-methyloctyloxy, 2,2-dimethyloctyloxy, 2,3-dimethyloctyloxy, 2-methyldecyloxy, 2,2-dimethyldecyloxy, and 2,3-dimethyldecyloxy, preferably tert-butoxy, 2-methyloctyloxy, 2,2-dimethyloctyloxy, and 2,3-dimethyldecyloxy; and more preferably a branched alkoxy group having from 3 to 8 carbon atoms including tert-butoxy and isopropoxy.

In particular, it is preferable that $R^1$ in Formula (I) is a straight-chain alkyl group having from 3 to 20 carbon atoms, a straight-chain alkoxy group having from 3 to 20 carbon atoms, a branched alkyl group having from 3 to 20 carbon atoms, or a branched alkoxy group having from 3 to 20 carbon atoms; and $R^2$ is a straight-chain alkyl group having from 3 to 8 carbon atoms, a straight-chain alkoxy group having from 3 to 8 carbon atoms, a branched alkyl group having from 3 to 8 carbon atoms, or a branched alkoxy group having from 3 to 8 carbon atoms. Owing to this, an adequate solubility may be attained not only in a halogenated organic solvent but also in a non-halogenated organic solvent.

In addition, the thiazolothiazole derivative having the structure described above becomes easily produced and purified, whereby high purity products are easily obtained. Furthermore, the thiazolothiazole derivative having the structure described above allows a material such as a charge transporting material to be produced easily.

Further, in the exemplary embodiments of the present invention, the term of "dissolved" is used to describe a condition in which no crystals are found by visual observation after the thiazolothiazole derivative represented by Formula (I) is added to an organic solvent. Further, the phrase of "having an adequate solubility" is used to describe a condition in which an objective material is dissolved at the boiling point of an organic solvent.

As the organic solvent that dissolves the thiazolothiazole derivative represented by Formula (I), any organic solvent is usable as long as it dissolves the thiazolothiazole derivative represented by Formula (I). For example, conventional organic solvents such as methanol, ethanol, n-propanol, isopropylalcohol, n-butanol, benzylalcohol, methylcellosolve, ethylcellosolve, acetone, methylethylketone, cyclohexanone, methylacetate, n-butylacetate, dioxane, tetrahydrofuran, diethylether, toluene, xylene, mesitylene, dimethylformamide, dimethylacetoamide or dimethylsulfoxide, or the following halogenated organic solvents may be used solely or two or more kinds in combination.

The halogenated organic solvents may include a hydrocarbon or aromatic hydrocarbon compound that has at least one halogen atom such as fluorine, chlorine, bromine or iodine and that has a boiling point of preferably from 30° C. to 300° C. A hydrocarbon or aromatic hydrocarbon compound having at least one halogen atom and a boiling point of from 50° C. to 200° C. is more preferable.

Specific examples of the halogenated organic solvents may include: halogenated hydrocarbons such as chloroform, carbon tetrachloride, or dichloroethylene; and halogenated aromatic hydrocarbons such as chlorobenzene, dichlorobenzene, trichlorobenzene, chloromethylbenzene, o-chlorotoluene, o- or p-dichlorotoluene, or trichlorotoluene.

The thiazolothiazole derivative represented by Formula (I) is synthesized by, for example, following methods, but these are not limitative.

(1) After the position-5 of thiophene adjacent to the thiazolothiazole portion is halogenated, the derivative is synthesized through the Suzuki reaction between an alkyl or alkoxy substituted phenyl boronic acid or a pinacol boron and the former halogenated product.

(2) After an alkyl or alkoxy group substituted phenylthiophene is synthesized through the Suzuki reaction between an alkyl or alkoxy substituted phenyl bromide and thiophene boronic acid, the derivative is synthesized by formylation of the position-5 of the alkyl or alkoxy group substituted phenylthiophene followed by cyclization with rubeanic acid or the like.

The synthesis method of (2) is described in JP-A No. 2006-206503, for example.

In the reaction of (1), a thiazolothiazole structure containing thiophenes is formed at first, then the position-5 of the thiophene is halogenated, further end substitution groups are incorporated through the Suzuki reaction between the halogenated one and an alkyl or alkoxy phenyl boronic acid or a pinacol boron, whereby the derivative may be purified in each step, chemically stable, proving an adequate yield of reaction.

Therefore, in comparison with the synthesis method of (2), the synthesis method of (1) is preferable, from the viewpoint of purification caused by excellent solubility, and stability of intermediate.

The method of producing the thiazolothiazole derivative will be specifically described. In the exemplary embodiments of the present invention, for example, the derivative is synthesized as described in J. Am. Chem. Soc., Vol. 92, page 4046 (1970) by J. R. Johnson, D. H. Rotenberg, and R. Ketcham: rubeanic acid and a thiophene aldehyde derivative represented by the following Formula (II-1) are subjected to cyclization to synthesize thiophene-containing thiazolothiazole (represented by the following Formula (III-1)); the resulting cyclization product is halogenated by a known method with N-bromosuccinic amide or the like to obtain a halogenated compound represented by the following Formula (IV-1); the halogenated compound is subjected to coupling reaction through the Suzuki reaction with a substituted phenylboronic acid represented by the following Formula (V-1) or a substituted phenylpinacol boron and a palladium catalyst to synthesize the thiazolothiazole derivative (represented by Formula (I)).

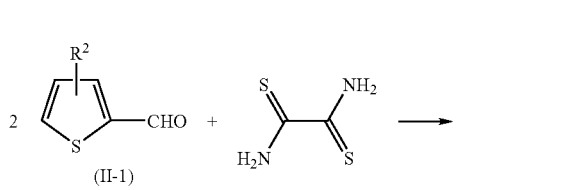

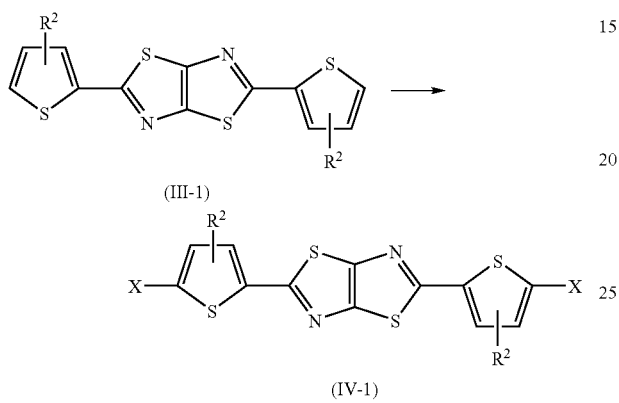

(III-1)

R² in Formula (II-1) and R² in Formula (III-1), each is the same as R² in Formula (I).

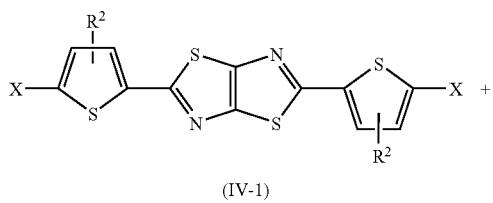

In Formula (IV-1), R² is the same as R² in Formula (I). X represents bromine atom or iodine atom.

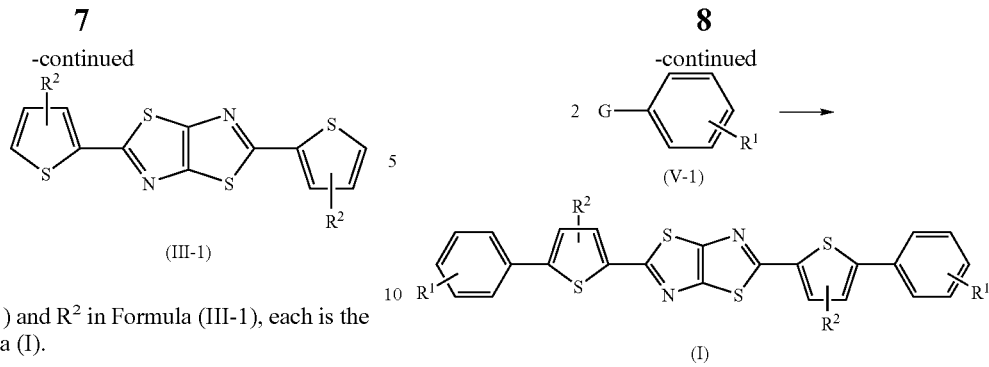

In Formula (V-1), R¹ is the same as $R^1$ in Formula (I). G represents boronic acid group or a boronic acid ester group.

As the boronic acid ester group, for example, the following ones are suitably used from the viewpoint of availability of reagent chemicals.

Specific examples of the boronic acid ester group may include boronic acid pinacolate ester group, boronic acid 1,3-propanediol ester group, and boronic acid neopentylglycol ester group.

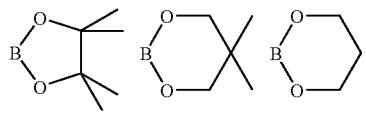

Hereinafter, synthesis examples for some of the specific compounds will be described, but the other specific compounds may be synthesized. Further, these synthesis methods are not limitative.

For the identification of objectives, ¹H-NMR spectra (¹H-NMR, solvent: $CDCl_3$, UNITY-300 manufactured by VARIAN Corp., 300 MHz) and IR spectra (KBr tablet method, a fourier transform infrared spectrometer (FT-730, manufactured by HORBA Ltd., resolution: 4 cm⁻¹) are used.

Specific compounds of the thiazolothiazole derivative represented by Formula (I) are described below, but these are not limitative.

| No. | R¹ | R¹ Linking Position | R² | R² Linking Position |
|---|---|---|---|---|
| 1 | ~~~CH₃ | 4 | —H | 3 |
| 2 | ~~~CH₃ | 4 | —H | 3 |
| 3 | ~~~~CH₃ | 4 | —H | 3 |
| 4 | ~~~~~CH₃ | 4 | —H | 3 |
| 5 | ~~~~~~~CH₃ | 4 | —H | 3 |
| 6 | ~~~CH₃ | 4 | —H | 3 |
| 7 | ~~~CH₃ | 4 | —CH₃ | 3 |

-continued

| No. | R¹ | R¹ Linking Position | R² | R² Linking Position |
|---|---|---|---|---|
| 8 | CH₃(CH₂)₇— (n-octyl) | 4 | —CH₃ | 3 |
| 9 | CH₃(CH₂)₁₁— (n-dodecyl) | 4 | —CH₃ | 3 |
| 10 | —O—CH₃ | 4 | —O—CH₃ | 3 |
| 11 | —O—CH₂CH₂CH₃ | 4 | —H | 3 |
| 12 | —O—(CH₂)₄CH₃ | 4 | —(CH₂)₃CH₃ | 3 |
| 13 | —O—(CH₂)₆CH₃ | 4 | —CH₃ | 3 |
| 14 | —O—(CH₂)₉CH₃ | 4 | 3-methylhexyl (H₃C–CH(–CH₂CH₃)–CH₂CH₂CH₂CH₃) | 3 |
| 15 | —C(CH₃)₃ | 4 | —H | 3 |
| 16 | 3-ethyl-3-methylhexyl branched alkyl | 4 | 3-methylpentyl (H₃C–CH(–CH₂CH₃)–CH₂CH₃) | 3 |
| 17 | 3-ethylheptyl branched alkyl | 4 | —O—CH₂CH(CH₃)CH₃ (isobutoxy) | 3 |
| 18 | —O—CH₂—C(CH₃)₂—(CH₂)₃CH₃ branched | 4 | —O—(CH₂)₂CH₃ | 3 |

-continued
| No. | R¹ | R¹ Linking Position | R² | R² Linking Position |
|---|---|---|---|---|
| 19 | 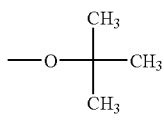 | 4 | 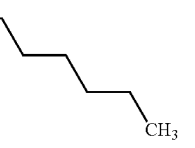 | 3 |
| 20 | 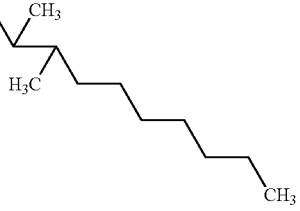 | 4 | —CH₃ | 3 |
| 21 | 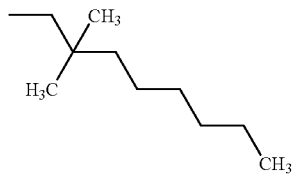 | 4 | —H | 3 |
| 22 | 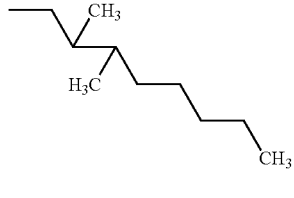 | 4 | 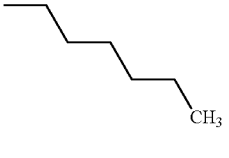 | 3 |
| 23 | 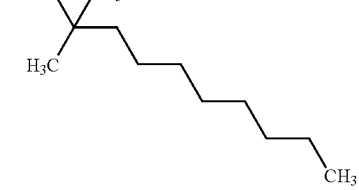 | 4 | —CH₃ | 3 |
| 24 | 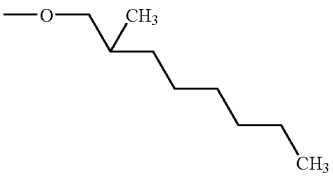 | 4 | 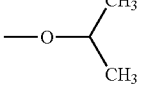 | 3 |
| 25 | 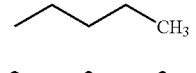 | 4 | 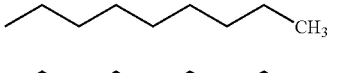 | 3 |
| 26 |  | 4 |  | 3 |
| 27 |  | 4 |  | 3 |
| 28 |  | 4 |  | 3 |
| 29 | 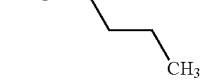 | 4 |  | 3 |

-continued
| No. | R¹ | R¹ Linking Position | R² | R² Linking Position |
|---|---|---|---|---|
| 30 | 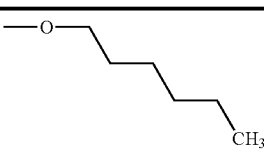 | 4 | 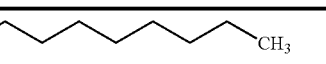 | 3 |
| 31 | 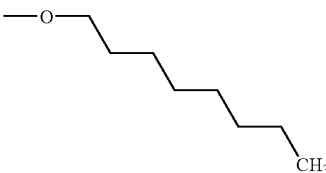 | 4 | 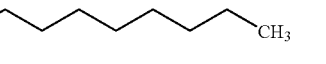 | 3 |
| 32 | 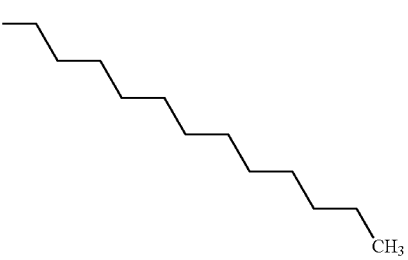 | 4 | 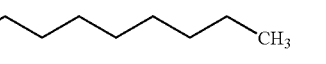 | 3 |
| 33 | 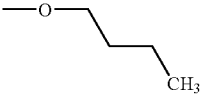 | 2 | 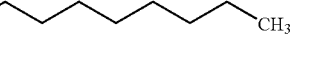 | 3 |
| 34 | 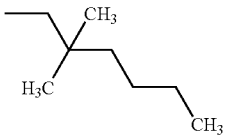 | 2 | 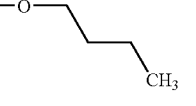 | 3 |
| 35 | 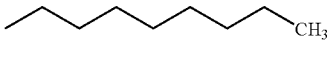 | 2 | 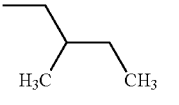 | 3 |
| 36 | 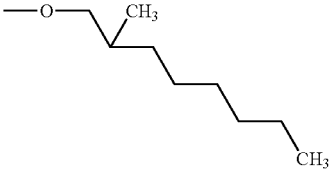 | 2 | —CH₃ | 3 |
| 37 |  | 3 | 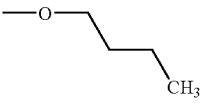 | 3 |
| 38 | 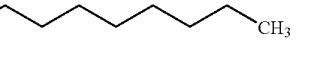 | 3 | 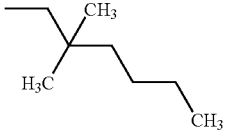 | 3 |
| 39 | 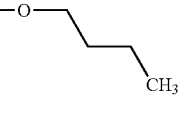 | 3 | 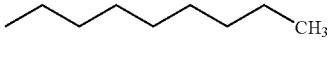 | 3 |

-continued

| No. | R¹ | R¹ Linking Position | R² | R² Linking Position |
|---|---|---|---|---|
| 40 | 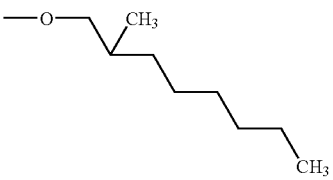 | 3 | —CH₃ | 3 |

The organic semiconductor transistor of the exemplary embodiments of the present invention has plural electrodes and an organic semiconductor layer that contains at least one compound represented by the following Formula (I). As long as this configuration is satisfied, the other configuration is not particularly limited.

Hereinafter, with reference to the accompanied figures, more detail description will be made, but the description is not limitative.

Figure 2:
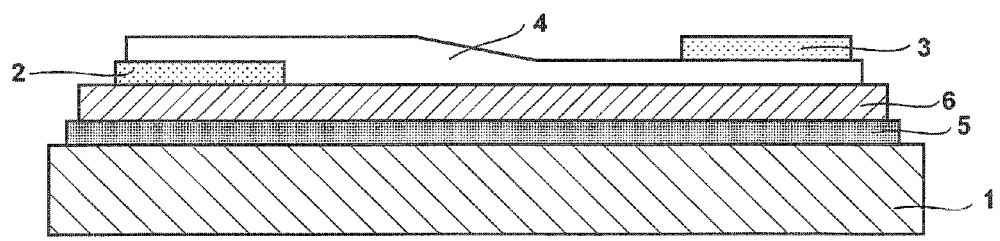
FIG. 2 is a schematic diagram showing an example of a layered configuration of an organic semiconductor transistor in another exemplary embodiment of the present invention.
Figure 3:
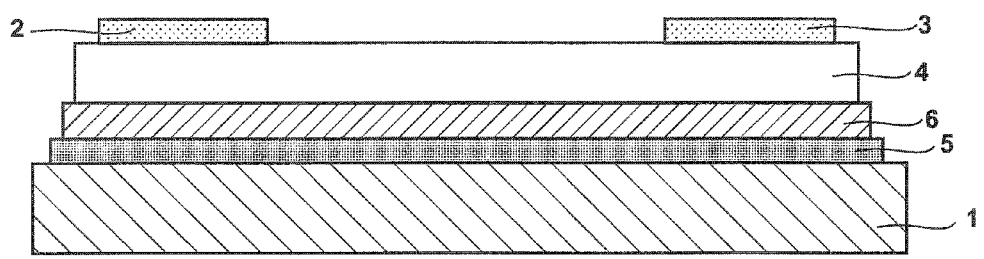
FIG. 3 is a schematic diagram showing an example of a layered configuration of an organic semiconductor transistor in still another exemplary embodiment of the present invention.
Figure 4:
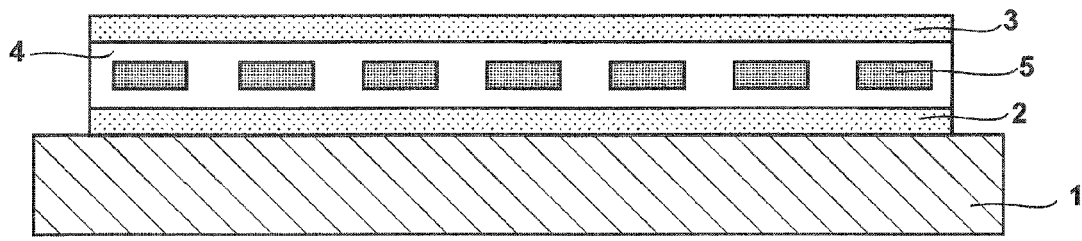
FIG. 4 is a schematic diagram showing an example of a layered configuration of an organic semiconductor transistor in still another exemplary embodiment of the present invention.

FIGS. 1, 2, 3, and 4 show cross-sectional views illustrating the configuration of an example of the organic semiconductor transistor of the exemplary embodiments of the present invention. FIGS. 1, 2, and 3 show field effect organic semiconductor transistors. FIG. 4 shows a static induction organic semiconductor transistor.

The field effect organic semiconductor transistors shown in FIGS. 1, 2, and 3, each has a source electrode 2 and a drain electrode 3 that are disposed in a manner that they are separated from each other with a distance therebetween, an organic semiconductor layer 4 that is in contact with both of the source electrode 2 and the drain electrode 3, a gate electrode 5 that is separated from both of the source electrode 2 and the drain electrode 3, and an insulation layer 6 that is sandwiched between the organic semiconductor layer 4 and the gate electrode 5.

The field effect organic semiconductor transistors are one mode of transistors that are widely used presently, having advantages of high speed switching performance, simplicity in production processes, and suitability for integration.

The field effect organic semiconductor transistors shown in FIGS. 1, 2, and 3 control the current that passes from the source electrode 2 to the drain electrode 3 by an action of the voltage applied to the gate electrode 5.

The organic semiconductor transistor shown in FIG. 1 has the gate electrode 5 on a substrate 1 and further has the insulation layer 6 on the gate electrode 5. On the insulation layer 6, the source electrode 2 and the drain electrode 3 are formed in a manner that they are separated from each other with a distance therebetween. The insulation layer 6 that is exposed out of the source electrode 2 and the drain electrode 3 is covered with the organic semiconductor layer 4.

In the organic semiconductor transistor shown in FIG. 2, either one of the source electrode 2 and the drain electrode 3 is formed on the insulation layer 6; the organic semiconductor layer 4 is formed in a manner that the organic semiconductor layer 4 covers the source electrode 2 or the drain electrode 3, which is formed on the insulation layer 6, and the insulation layer 6; and either one of the source electrode 2 and the drain electrode 3, which is not formed, is formed on the organic semiconductor layer 4 in a manner that the organic semiconductor layer 4 is sandwiched between the source electrode 2 and the drain electrode 3.

In the organic semiconductor transistor shown in FIG. 3, the organic semiconductor layer 4 is formed on the insulation layer 6, and the source electrode 2 and the drain electrode 3 are formed on the organic semiconductor layer 4 in a manner that they are separated from each other with a distance therebetween.

The static induction transistor shown in FIG. 4 has the source electrode 2 and the drain electrode 3 that face to each other, the organic semiconductor layer 4 that is in contact with both of the source electrode 2 and the drain electrode 3, and the gate electrodes 5 that are separated from both of the source electrode 2 and the drain electrode 3. Namely, the static induction transistor has, on the substrate 1, the source electrode 2, the organic semiconductor layer 4, and the drain electrode 3 in this order, and has plural gate electrodes 5 within the organic semiconductor layer 4. The gate electrodes 5 are disposed parallel to both of the source electrode 2 and the drain electrode 3 in a direction from the front side to the rear side of the paper, and gate electrodes 5 are also disposed parallel to each other.

In the organic semiconductor transistors shown in FIGS. 1, 2, 3, and 4, the current that passes from the source electrode 2 to the drain electrode 3 is controlled by the voltage applied to the gate electrode 5.

As the material used for each electrode, which allows charges to be injected efficiently, metal, metal oxide, electroconductive polymer, carbon, graphite, and the like are used.

Examples of the metal used for the electrodes may include magnesium, aluminum, gold, silver, copper, platinum, chromium, tantalum, indium, palladium, lithium, calcium, and the alloys thereof. Examples of the metal oxide may include a metal oxide film such as lithium oxide, magnesium oxide, aluminum oxide, tin oxide, indium oxide, zinc oxide, indium zinc oxide, indium tin oxide (ITO) or tin oxide (NESA).

Examples of the electroconductive polymer used for the electrodes may include polyaniline, polythiophene, polythiophene derivatives, polypyrrole, polypyridine, and a complex of polyethylene dioxythiophene and polystyrene sulfonic acid.

Further, in the exemplary embodiments of the present invention, "electroconductive" means that the volume resistivity is in the range of $10^7$ Ωcm or lower. On the other hand, "insulating" means that the volume resistivity is in the range of $10^{14}$ Ωcm or higher.

The volume resistivity is measured in accordance with JIS-K-6911 (1995) as: by using a circular electrode (a UR probe of HIRESTOR IP (manufactured by Mitsubishi Yuka Co., Ltd.): the outside diameter of a cylindrical electrode is 16 mm, the inside diameter of a ring electrode is 30 mm, and the outside diameter of the ring electrode is 40 mm), under an environment of 22° C. and 55% RH, a voltage of 100 volt is applied; 5 seconds later, the current is measured with R8340A ULTRA HIGH RESISTANCE METER manufactured by ADVANTEST CORP. Volume resistance is obtained from the measured current value, and the volume resistivity is calculated from the volume resistance.

The difference between the ionization potential of the material used for the drain electrode 3 and the source electrode 2 and the ionization potential of the compound that is represented by Formula (I) used for the organic semiconductor layer 4 is preferably within 1.0 eV and particularly preferably within 0.5 eV, considering charge injection characteristics.

Considering the difference between the ionization potentials of these electrodes and the compound represented by Formula (I), Au is preferably used as the electrode material.

Further, when an electroconductive substrate is used, for instance, in the case of a highly doped silicon substrate, the substrate may also serve as the gate electrode.

The method of forming the electrodes may include: a process in which a film of the above material is formed by vacuum evaporation or sputtering, and then the resulting thin film is formed into the electrodes by using conventional photolithographic or lift-off techniques; a process in which aluminum or the like is heat transferred; and a process in which a resist layer is formed by using ink-jet technique or the like, and then the resulting resist layer is etched. In still another process, an electroconductive polymer is dissolved in a solvent, and the resulting solution may be subjected to patterning using the ink-jet technique or the like.

The thickness of the source electrode 2 and the drain electrode 3 is not particularly limited, but usually preferably ranges from several nm to several hundred µm, more preferably from about 1 nm to about 100 µm, still more preferably from about 10 nm to about 10 µm.

The distance (channel length) between the source electrode 2 and the drain electrode 3 usually ranges preferably from several hundred nm to several mm and more preferably from about 1 µm to about 1 mm.

The insulation layer 6 may be made of an inorganic material such as silicon dioxide, silicon nitride, tantalum oxide, aluminum oxide, titanium oxide, tantalum oxide, tin oxide, vanadium oxide, or strontium barium titanate; an organic insulating polymer such as polycarbonate resin, polyester resin, methacrylic resin, acrylic resin, polyvinylchloride resin, cellulose resin, urethane resin, epoxy resin, polystyrene resin, polyvinylacetate resin, a copolymer of styrene and butadiene, a copolymer of vinylidene chloride and acrylonitrile, a copolymer of vinylchloride, vinylacetate, and maleic anhydride, or silicone resin; and the like, but they are not limitative.

Example of the method of forming the insulation layer produced from the inorganic material may be included a dry process such as vacuum evaporation, molecular beam epitaxial growth, ion-cluster-beam method, low energy beam method, ion plating method, CVD, sputtering, and atmospheric pressure plasma method; and a wet coating process such as spray coating, spin coating, blade coating, dip coating, casting, roll coating, bar coating, die coating, the air-knife method, or the ink-jet method. These methods may be selected in accordance with the characteristics of the material used and the objective devices.

As the method of forming the insulation layer in which the organic insulating polymer is used, the above wet process may be preferably used.

The thickness of the insulation layer 6 is not particularly limited, but usually ranges preferably from several nm to several hundred µm, more preferably from about 1 nm to about 100 µm, and still more preferably from about 10 nm to about 10 µm.

The interface of the insulation layer 6 that is in contact with the organic semiconductor layer 4 may be treated with, for example, a silane compound such as hexamethyl disilazane, octadecyl trimethoxysilane, octadecyl trichlorosilane, or octyl trichlorosilane. In the case where the insulation layer 6 is an organic insulation layer, the layer may be subjected to lapping treatment.

Examples of the substrate 1 may include a substrate of silicon single crystal highly doped with phosphorus or the like, a glass substrate, and a substrate of plastics such as polycarbonate resin, polyester resin, methacrylic resin, acrylic resin, polyvinylchloride resin, cellulose resin, urethane resin, epoxy resin, polystyrene resin, polyvinylacetate resin, a copolymer of styrene and butadiene, a copolymer of vinylidene chloride and acrylonitrile, a copolymer of vinylchloride, vinylacetate and maleic anhydride, or silicone resin, but these are not limitative.

In particular, when the organic semiconductor transistor of the exemplary embodiments of the present invention is used in an electronic circuit that is used for electronic or digital paper or portable electronic devices, a flexible substrate is preferably used as the substrate 1. In particular, a flexible substrate having a bending elastic modulus of at least 1,000 MPa may provide a still more flexible driving circuit or electronic circuit for display devices.

As the method of forming the organic semiconductor layer 4, may be used a wet printing process including spin coating, casting, dip coating, die coating, roll coating, bar coating, and the ink-jet method.

As described above, the compounds represented by Formula (I) exhibit an excellent solubility in an organic solvent, whereby the wet process of forming the organic semiconductor layer in which a solution dissolving these compounds is used is a preferable process of forming an organic semiconductor that contains the compounds represented by Formula (I).

Examples of the solvent used for the coating liquid may include: water; alcohols such as methanol, ethanol, isopropyl alcohol, or butanol; ketone solvents such as acetone, methylethylketone, methylisobutylketone, or cyclohexanone; ester solvents such as ethylacetate or butylacetate; hydrocarbon solvents such as hexane, octane, toluene, xylene, ethylbenzene, or cumene; halogenated hydrocarbon solvents such as dichloromethane, chloroform, dichloroethane, tetrachloroethylene, chlorobenzene, o-dichlorobenzene, or trichlorobenzene; nitrile solvents such as acetonitrile, propionitrile, methoxyacetonitrile, glutarodinitrile, or benzonitrile; and aprotic polar solvents such as dimethylsulfoxide, sulfolane, N,N-dimethylformamide, N,N-dimethylacetoamie, or N-methyl-2-pyrrolidone, but these are not limitative. These solvents may be used solely or two or more kinds in combination.

The thickness of the organic semiconductor layer 4 is not particularly limited, but may range preferably from several nm to several hundred µm, more preferably from about 1 nm to about 100 µm, and still more preferably from about 5 nm to about 10 µm.

The organic semiconductor layer 4 may be doped. Either of a donor dopant or an acceptor dopant may be used.

As the donor dopants, any compounds that are capable of donating electrons to the organic compound of the organic semiconductor layer 4 may be preferably used. Examples of the donor dopant may include: an alkali metal such as Li, Na, K, Rb, or Cs; an alkaline earth metal such as Ca, Sr, or Ba; a rare earth metal such as Y, La, Ce, Pr, Nd, Sm, Eu, Gd, Tb, Dy, Ho, Er, or Yb; and an ammonium ion.

As the acceptor dopant, any compounds that are capable of eliminating electrons from the organic compound of the organic semiconductor layer 4 may be preferably used. Examples of the acceptor dopant may include: a halogen compound such as $Cl_2$, $Br_2$, $I_2$, ICl, $ICl_3$ or IBr; a Lewis acid such as $PF_5$, $AsF_6$, $SbF_5$, $BF_3$, or $SO_3$; a protonic acid such as HF, HCl, $HNO_3$, or $H_2SO_4$; an organic acid such as acetic acid, formic acid, or amino acid; a transition metal compound such as $FeCl_3$, $TiCl_4$, or $HfCl_4$; an electrolyte anion such as $Cl^-$, $Br^-$, $I^-$, $ClO4^-$, or sulfonic acid anion; and an organic compound such as tetracyanoethylene, 7,7,8,8-tetracyanoquinodimethane, 11,11,12,12-tetracyanonaphto-2,6-quinodimethane, 2,5-difluoro-7,7,8,8-tetracyanoquinodimethane, or tetrafluoro tetracyanoquinodimethane.

Furthermore, in order to prevent degradation of the organic semiconductor transistor caused by water or oxygen, a protective layer may be provided. Specific examples of the material for the protective layer may include: metal such as In, Sn, Pb, Au, Cu, Ag, or Al; metal oxide such as MgO, $SiO_2$, or $TiO_2$; and resins such as polyethylene resin, polyurea resin, or polyimide resin. The protective layer may by formed by vacuum evaporation, sputtering, plasma polymerization, CVD, or coating method.

In the organic semiconductor transistor of the exemplary embodiments of the present invention, the compound represented by Formula (I) is used for the organic semiconductor layer. The compound represented by Formula (I) exhibits an excellent solubility in an organic solvent that is generally used in the production of electronic devices. Therefore, when the compound represented by Formula (I) is used for the organic semiconductor layer, the organic semiconductor layer is allowed to be produced in a wet process, whereby the organic semiconductor layer may be formed by inexpensive apparatus in comparison with a method of forming a layer by sputtering, and a device is allowed to have a large area easily. In addition to that, in the organic semiconductor layer that contains the compound represented by Formula (I) and is formed in a wet process, failures such as cracks, crazes, or chips are prevented from being developed in the process of forming the layer. As a result, an organic semiconductor transistor having stable electrical characteristics over time is provided.

When an electronic device using the organic semiconductor transistor of the exemplary embodiments of the present invention is produced, a configuration (semiconductor unit) having on a support at least one of the organic semiconductor transistor of the exemplary embodiments of the present invention incorporated therein may be used, and the semiconductor unit is combined with the other elements, circuits, and the like so as to produce a desired electronic device.

EXAMPLES

Hereinafter, the present invention will be further described with reference to the following examples, but it should be construed that the invention is in no way limited to those examples.

For the identification of objective materials, $^1$H-NMR spectra ($^1$H-NMR, solvent: $CDCl_3$, UNITY-300 manufactured by VARIAN Corp., 300 MHz) and IR spectra (KBr tablet method, a fourier transform infrared (FT-IR) spectrometer (FT-730, manufactured by HORIBA Ltd., resolution: 4 $cm^{-1}$) are used.

Example 1

Synthesis of Compound III-a

In a 200 mL three-necked flask, 5.3 g (45 mmol) of rubeanic acid and 20 g (180 mmol) of 2-thiophene aldehyde are added and dissolved in 100 mL of dimethylformamide (hereinafter, referred to as DMF). The resulting reaction liquid is agitated magnetically at 150° C. for 5 hours, and then cooled to 25° C. The reaction liquid is added to 1 L of pure water in a 2 L beaker, and agitated magnetically at 25° C. for 30 minutes. After agitation, precipitated crystals are separated by suction filtration and washed with 1 L of pure water. The resulting crystals are further washed with 100 mL of methanol and vacuum-dried at 60° C. for 15 hours. After drying, the crystals are dissolved in 100 mL of tetrahydrofuran (hereinafter, referred to as THF). The resulting solution is treated with a silica gel short column to obtain 6.4 g of Compound III-a, which is identified to be the objective compound by $^1$H-NMR and IR.

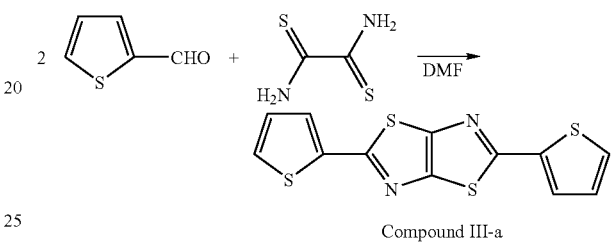

Compound III-a

Synthesis of Compound IV-a

Under a nitrogen gas atmosphere, 4.5 g (15 mmol) of the Compound III-a and 8.0 g (45 mmol) NBS are put in a 500 mL three-necked flask, and dissolved in 200 mL of DMF. The resulting reaction solution is agitated magnetically at 60° C. for 7 hours to complete reaction. After cooled to 25° C., the reaction solution is added to 1 L of pure water in a 2 L beaker and agitated at 25° C. for 30 minutes magnetically. After agitation, the precipitated crystals are separated by suction filtration and washed with 1 L of pure water. After vacuum drying at 60° C. for 15 hours, the crystals are recrystallized twice with N-methylpyrrolidone (hereinafter, referred to as NMP) to obtain 3.3 g of yellow color crystals of the Compound IV-a, which are identified to be the objective compound by $^1$H-NMR and IR.

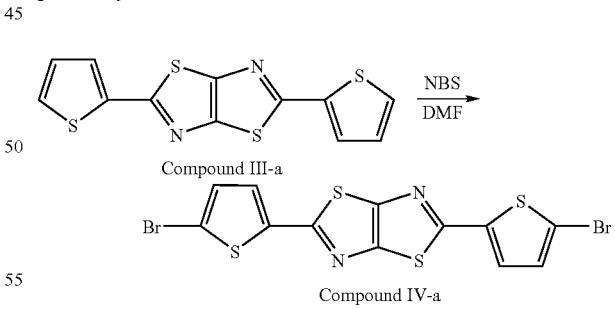

Synthesis of Exemplary Compound 1

Under a nitrogen gas atmosphere, 0.23 g (0.20 mmol) of tetrakis triphenylphosphine palladium (0) is dissolved in 100 mL NMP in a 300 mL three-necked flask. To the resulting solution, 1.84 g (4.0 mmol) of the Compound IV-a, 8.0 mL of a 2M sodium carbonate aqueous solution, and 1.56 g (8.8 mmol) of 4-n-butylphenyl boronic acid are added in this order, and the resulting reaction liquid is refluxed in a 220° C.

oil bath for 5 hours while agitated magnetically. After the completion of the reaction is confirmed by ¹H-NMR, the reaction liquid is cooled to 25° C. and transferred to a 2 L beaker (with 1 L of pure water) and agitated magnetically at 25° C. for 30 minutes. After agitation, the precipitated crystals are separated by suction filtration and washed with 1 L of pure water. The resulting crystals are further washed with 100 mL of methanol and 100 mL of toluene, and vacuum-dried at 60° C. for 15 hours. To the crystals, 150 mL NMP are added so as to recrystallize the crystals, which are further purified by sublimation. In this way, 1.0 g of orange color crystals of the Exemplary Compound 1 is obtained, which are identified to be the objective compound by ¹H-NMR and IR.

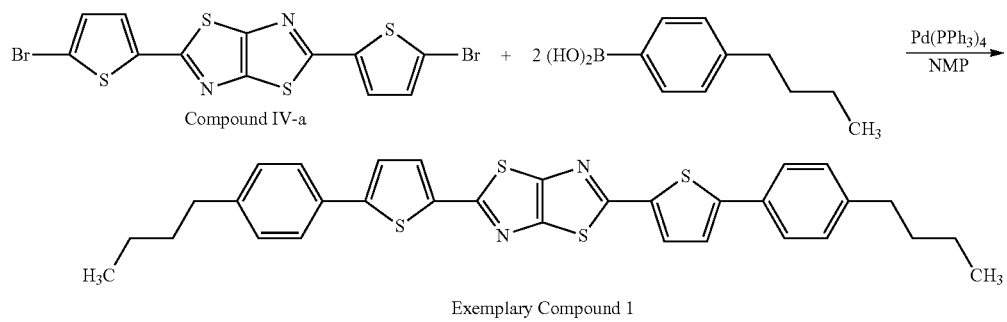

Exemplary Compound 1

<Producing of Organic Semiconductor Transistor>

On a silicon substrate having an electrical resistivity of 0.007 Ωcm that doubles as a gate electrode, a 200 nm thick $SiO_2$ film is formed by thermal oxidation, which serves as an insulation film.

On the insulation film, a 5 nm thick of titanium film and a 100 nm thick of gold film are formed by vacuum evaporation in this order, and they are subjected to patterning by photolithography to form a source electrode and a drain electrode. The channel length from the source electrode to the drain electrode is 25 μm, and the channel width is 1 mm.

After that, the silicon substrate is subjected to 2 minute ultrasonic cleaning in an electronic grade acetone, 2 minute ultrasonic cleaning in an electronic grade 2-propanol, drying with a dried nitrogen gas, and 15 minute UV-ozone irradiation so as to clean the surface thereof.

The Exemplary Compound 1 in an amount of 0.4% by mass is dissolved in an electronic grad toluene. The resulting solution is coated on the cleaned silicon substrate by drop coating. After the coating is left for drying, it is heated under a nitrogen gas atmosphere at 100° C. for 1 minute to obtain an organic semiconductor layer. In this way, an organic semiconductor transistor is produced. The resulting organic semiconductor layer has a thickness of 85 nm.

The organic semiconductor transistor produced as described above exhibits p-type transistor characteristics.

<Measurement of Charge Mobility>

Charge mobility is obtained from the saturation region of the current to voltage characteristics of the resulting transistor. In addition, the transistor is stored at 25° C., and, one month later, the characteristics of the transistor are evaluated so as to measure the charge mobility again. The results are shown in Table 1.

<Film Formability>

The surface of the above prepared organic semiconductor layer is observed with an optical microscope within an area of 1 mm×1 mm so as to find failures such as cracks, crazes, or chips. The results are shown in Table 1. The evaluation criteria are shown below. Further, the film formability is also evaluated for the case where the solvent is replaced from toluene to tetrahydrofuran.

Evaluation Criteria for Film Formability

The following criteria are used for the evaluation of the results observed with the microscope.

A: the surface is observed to be entirely covered with the film, ranked as excellent, B: portions that are not partly covered with the film are observed, and C: many portions that are not covered with the film are observed.

Example 2

Synthesis of Exemplary Compound 11

Under a nitrogen gas atmosphere, 0.14 g (0.12 mmol) of tetrakis triphenylphosphine palladium (0) is dissolved in 100 mL NMP in a 300 mL three-necked flask. To the resulting solution, 1.85 g (4.0 mmol) of the Compound IV-a, 8.0 mL of a 2M sodium carbonate aqueous solution, and 1.71 g (8.8 mmol) of 4-n-butoxyphenyl boronic acid are added in this order, and the resulting reaction liquid is refluxed in a 220° C. oil bath for 4 hours while agitated magnetically. After the completion of the reaction is confirmed by ¹H-NMR, the reaction liquid is cooled to 25° C. and transferred to a 2 L beaker with 1 L of pure water and agitated magnetically at 25° C. for 20 minutes. After agitation, the precipitated crystals are separated by suction filtration and washed with 1 L of pure water. The resulting crystals are further washed with 200 mL of methanol and 250 mL of toluene, and vacuum-dried at 60° C. for 15 hours. To the crystals, 150 mL NMP are added so as to recrystallize the crystals, which are further purified by sublimation. In this way, 1.0 g of orange color crystals of the Exemplary Compound II is obtained, which are identified to be the objective compound by ¹H-NMR and IR.

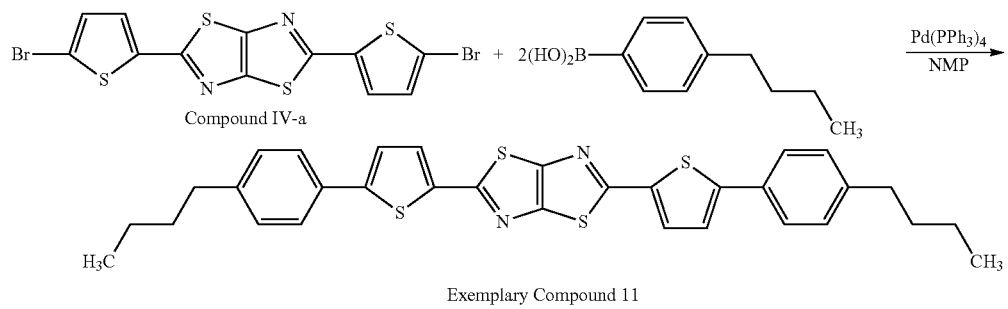

Exemplary Compound 11

<Production and Evaluation of Organic Semiconductor Transistor>

An organic semiconductor transistor is produced and evaluated substantially similarly to Example 1, except that Exemplary Compound II is used in place of Exemplary Compound 1.

Example 3

Synthesis of Compound III-b

In a 1 L three-necked flask, 18 g (150 mmol) of rubeanic acid and 75 g (600 mmol) of 3-methylthiophene-2-aldehyde are added and dissolved in 350 mL of DMF. The resulting reaction solution is agitated magnetically at 150° C. for 5 hours, and then cooled to 25° C. The reaction solution is added to 1 L of pure water in a 2 L beaker, and agitated magnetically at 25° C. for 30 minutes. After agitation, precipitated crystals are separated by suction filtration and washed with 1 L of pure water. After 100 mL of toluene and 200 mL methanol are added to the resulting sticky black color crystals, the crystals are washed by ultrasonic and magnetic agitation for 10 minutes. Thus washed crystals are separated by suction filtration to obtain 34 g of crude crystals, which are further washed with 200 mL of methanol and vacuum-dried at 60° C. for 15 hours. After dried, the crystals are dissolved in 500 mL of monochlorobenzene. The resulting solution is treated with a silica gel short column to obtain 19 g of Compound III-b, which is identified to be the objective compound by $^1$H-NMR and IR.

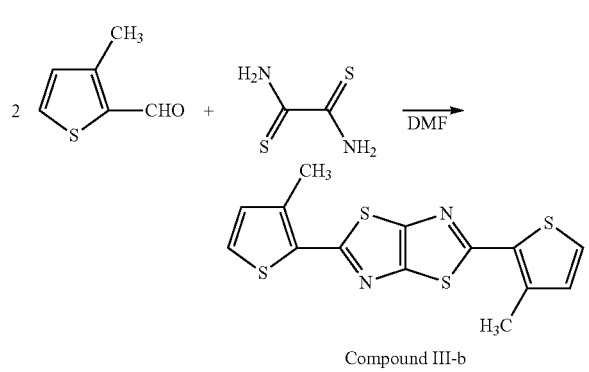

Compound III-b

Synthesis of Compound IV-b

Under a nitrogen gas atmosphere, 19 g (57 mmol) of Compound III-b and 23 g (129 mmol) NBS are put in a 1 L three-necked flask, and dissolved in 500 mL of DMF. The resulting reaction solution is agitated magnetically at 60° C. for 4 hours to complete reaction. After cooled to 25° C., the reaction solution is added to 1 L of pure water in a 2 L beaker and agitated magnetically at 10° C. for 30 minutes. After agitation, the precipitated crystals are separated by suction filtration and washed with 1 L of pure water and 200 mL of methanol. After 15 hour vacuum drying at 60° C., the crystals are recrystallized twice with 300 mL NMP to obtain 21 g of yellow color crystals of Compound IV-b, which are identified to be the objective compound by $^1$H-NMR and IR.

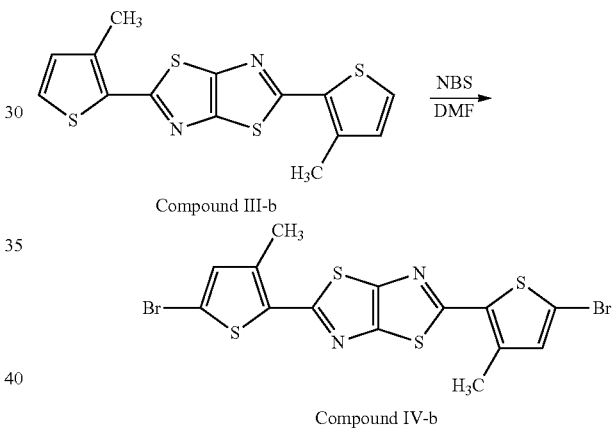

Synthesis of Exemplary Compound 7

Under a nitrogen gas atmosphere, 0.16 g (0.14 mmol) of tetrakis triphenylphosphine palladium (0) is dissolved in 100 mL NMP in a 300 mL three-necked flask. To the resulting solution, 2.2 g (4.5 mmol) of Compound IV-b, 9.0 mL of a 2M sodium carbonate aqueous solution, and 1.78 g (10 mmol) of 4-n-buthylphenyl boronic acid are added in this order, and the resulting reaction liquid is refluxed in a 220° C. oil bath for 6 hours while agitated magnetically. After the completion of the reaction is confirmed by $^1$H-NMR, the reaction liquid is cooled to 25° C. and transferred to a 1 L beaker with 500 mL of pure water and agitated magnetically at 25° C. for 30 minutes. After agitation, the precipitated crystals are separated by suction filtration and washed with 300 mL of pure water. The resulting crystals are further washed with 200 mL of methanol and 100 mL of hexane, and vacuum-dried at 60° C. for 15 hours. The crystals are dissolved by heating in a mixed solvent of 200 mL of methanol and 100 mL of toluene, and are treated with a silica gel short column. After that, the crystals are recrystallized twice with 300 mL of toluene to obtain 0.70 g of orange color crystals of Exemplary Compound 7 is obtained, which are identified to be the objective compound by $^1$H-NMR and IR.

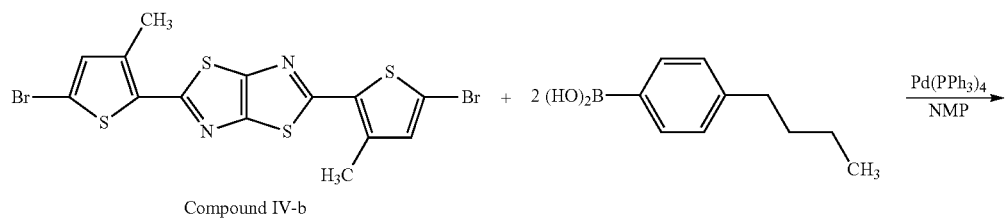

Compound IV-b

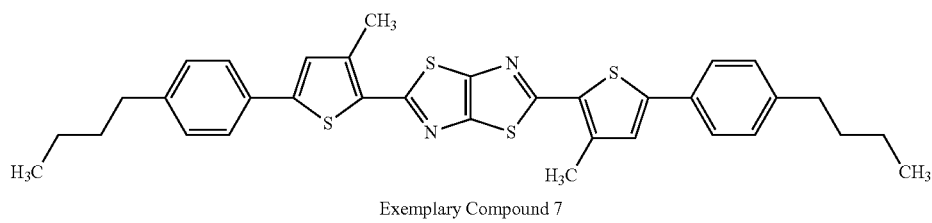

Exemplary Compound 7

<Production and Evaluation of Organic Semiconductor Transistor>

An organic semiconductor transistor is produced and evaluated substantially similarly to Example 1, except that Exemplary Compound 7 is used in place of Exemplary Compound 1.

Example 4

Synthesis of Compound V-a

Under a nitrogen gas atmosphere, 10 ml (16 mmol) of a hexane solution dissolving 1.6 M n-butyl lithium are added to a 100 mL three-necked flask cooled at −80° C. After the solution is cooled at −80° C., 10 mL of THF are dropped through a dropping funnel while the temperature is kept at −60° C. Then, 3.1 g (16 mmol) of 1-bromo-4-n-octylbenzene are dropped through a dropping funnel while the temperature is kept at −60° C. After the resulting mixture is agitated for 1 hour at −40° C., a solution dissolving 2.3 g (22 mmol) of trimethyl borate in THF (10 mL) is added through a dropping funnel while the temperature is kept at −40° C. After that, the temperature of the resulting mixture is gradually elevated to 10° C. over 2 hours, 50 mL of a 10% hydrochloric acid aqueous solution is added at 0° C., and the mixture is extracted with 100 mL of toluene. The extracted product is washed three times with 100 mL of pure water and then dried with sodium sulfate. Toluene is distilled out under reduced pressure to obtain 3.3 g of residue. The residue is further washed with a mixed liquid of 100 mL of pure water and 100 mL of hexane to obtain 2.0 g of Compound V-a, that is, 4-n-octylphenyl boronic acid, which is identified to be the objective compound by $^1$H-NMR and IR.

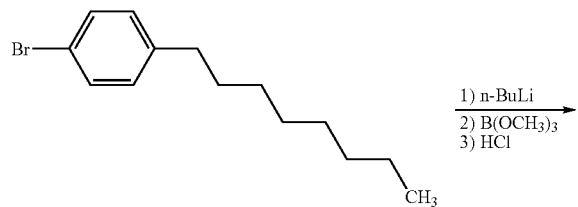

-continued (HO)$_2$B—⟨benzene⟩—(CH$_2$)$_7$CH$_3$

Compound V-a

Synthesis of Exemplary Compound 4

Under a nitrogen gas atmosphere, 0.11 g (0.10 mmol) of tetrakis triphenylphosphine palladium (0) is dissolved in 100 mL NMP in a 300 mL three-necked flask. To the resulting solution, 1.4 g (3.0 mmol) of Compound IV-a, 9.0 mL of a 2M sodium carbonate aqueous solution, and 1.4 g (6.0 mmol) of 4-n-octylphenyl boronic acid (Compound V-a) are added in this order, and the resulting reaction liquid is refluxed in a 200° C. oil bath for 5 hours while agitated magnetically. After the completion of the reaction is confirmed by $^1$H-NMR, the reaction liquid is cooled to 25° C. and transferred to a 2 L beaker with 1 L of pure water and agitated magnetically at 25° C. for 20 minutes. After agitation, the precipitated crystals are separated by suction filtration and washed with 300 mL of pure water. The resulting crystals are further washed with 200 mL of methanol and 100 mL of toluene, and vacuum-dried at 60° C. for 15 hours. The crystals are recrystallized with 200 mL NMP and then purified by sublimation so as to obtain 0.60 g of orange color crystals of Exemplary Compound 4, which are identified to be the objective compound by $^1$H-NMR and IR.

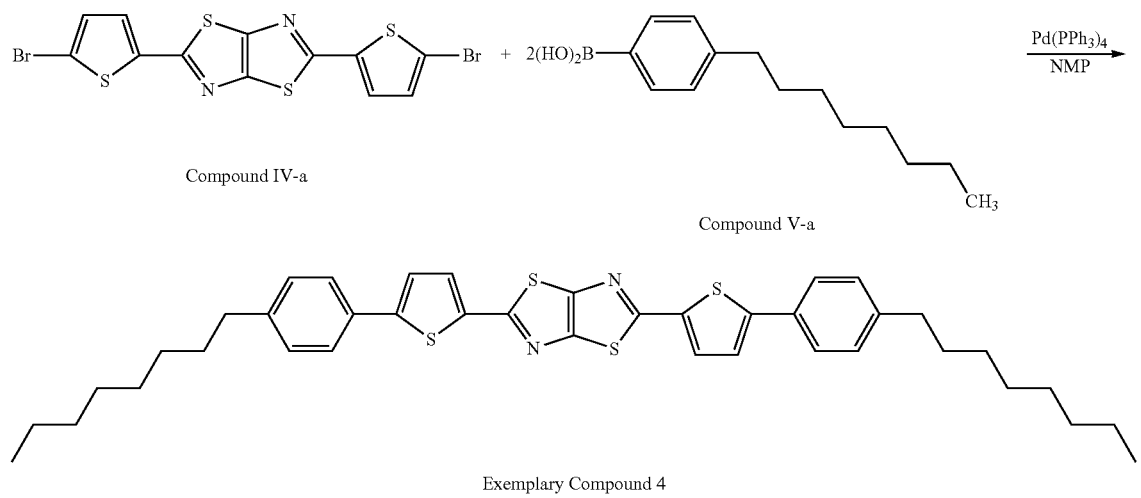

Compound IV-a

Compound V-a

Exemplary Compound 4

<Preparation and Evaluation of Organic Semiconductor Transistor>

An organic semiconductor transistor is produced and evaluated substantially similarly to Example 1, except that Exemplary Compound 4 is used in place of Exemplary Compound 1.

Example 5

Synthesis of Compound V-b

Under a nitrogen gas atmosphere, 20 ml (32 mmol) of a hexane solution dissolving 1.6 M n-butyl lithium are added to a 200 mL three-necked flask cooled at −80° C. After the solution is cooled at −80° C., 20 mL of THF are dropped through a dropping funnel while the temperature is kept at −60° C. Then, 10 g (32 mmol) of 1-boromo-4-n-dodecylbenzene are dropped through a dropping funnel while the temperature is kept at −60° C. After the resulting mixture is agitated for 1 hour at −40° C., a solution dissolving 4.5 g (43 mmol) of trimethyl borate in THF (10 mL) is added through a dropping funnel while the temperature is kept at −40° C. After that, the temperature of the resulting mixture is gradually elevated to 10° C. over 2 hours, 50 mL of a 10% hydrochloric acid aqueous solution is added at 0° C., and the mixture is extracted with 100 mL of toluene. The extracted product is washed three times with 100 mL of pure water and then dried with sodium sulfate. Toluene is distilled out under reduced pressure to obtain a residue. The residue is further washed with a mixed liquid of 100 mL of pure water and 100 mL of hexane to obtain 1.8 g of Compound V-b, that is, 4-n-dodecylphenyl boronic acid, which is identified to be the objective compound by $^1$H-NMR and IR.

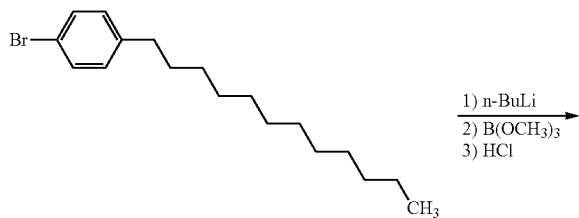

-continued

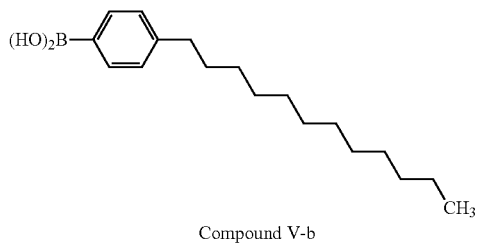

Compound V-b

Under a nitrogen gas atmosphere, 0.10 g (0.08 mmol) of tetrakis triphenylphosphine palladium (0) is dissolved in 100 mL NMP in a 300 mL three-necked flask. To the resulting solution, 1.2 g (2.5 mmol) of Compound IV-a, 6.0 mL of a 2M sodium carbonate aqueous solution, and 1.5 g (5.0 mmol) of 4-n-dodecylphenyl boronic acid, that is, Compound V-b, are added in this order, and the resulting reaction liquid is refluxed in a 220° C. oil bath for 5 hours while agitated magnetically. After the completion of the reaction is confirmed by $^1$H-NMR, the reaction liquid is cooled to 25° C. and transferred to a 1 L beaker with 400 mL of pure water and agitated magnetically at 25° C. for 30 minutes. After agitation, the precipitated crystals are separated by suction filtration and washed with 300 mL of pure water. The resulting crystals are further washed with 200 mL of methanol and 100 mL of toluene, and vacuum-dried at 60° C. for 15 hours. The crystals are recrystallized twice with 200 mL NMP and then purified by sublimation so as to obtain 0.13 g of orange color crystals of Exemplary Compound 5, which are identified to be the objective compound by $^1$H-NMR and IR.

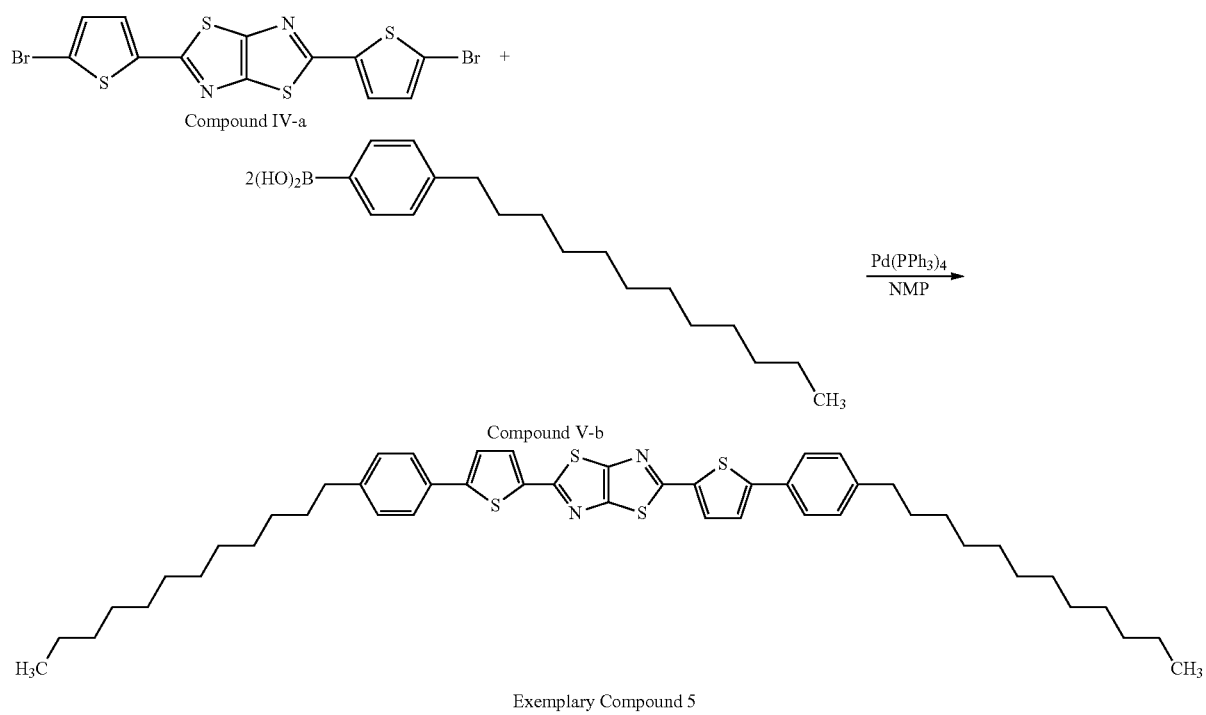

<Production and Evaluation of Organic Semiconductor Transistors>

An organic semiconductor transistor is produced and evaluated substantially similarly to Example 1, except that Exemplary Compound 5 is used in place of Exemplary Compound 1.

Example 6

Synthesis of Compound VI-a

In a 500 mL four-necked flask, 60 g (305 mmol) of 3-n-octylthiophene are dissolved in 100 mL of DMF. After the resulting solution is cooled to 5° C., a solution preliminary dissolving 55 g (310 mmol) of N-bromo succinimide (hereinafter, referred to as NBS) in 50 mL of DMF is dropped through isobaric dropping funnel over 5 minutes. After 1 hour agitation magnetically at 25° C., the solution is added to 500 mL of pure water in a 1 L beaker. The solution is further agitated magnetically at 25° C. for 20 minutes. To the solution, 300 mL of ethylacetate are added, and the solution is agitated magnetically at 25° C. for 10 minutes. The resulting ethylacetate phase is separated, washed three times with 300 mL of pure water, dried with anhydrous sodium sulfate, and is subjected to filtration and distillation under a reduced pressure so as to remove the solvent and to obtain 83 g of a yellow color oily product. The product is subjected to vacuum distillation (under a pressure of 1 to 3 mmHg, at a temperature of 120 to 130° C.) to obtain 76 g (yield: 93%) of a yellow color oily product (Compound VI-a).

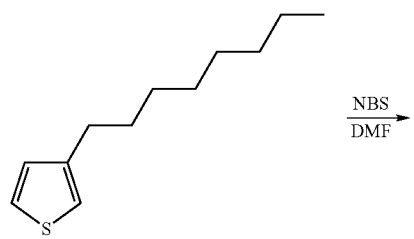

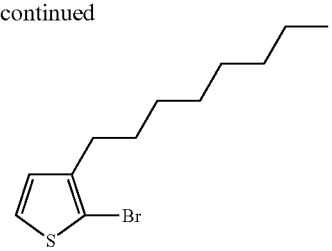

Compound VI-a

<Synthesis of Compound VI-b>

Under a nitrogen gas atmosphere, in a 500 mL four-necked flask that is fully dried, 9.1 g (374 mmol) of magnesium and 100 mL of THF are added. Three iodine granules are added to activate the surface of the magnesium. After the reaction mixture is heated to 60° C., a solution dissolving 100 g (363 mmol) of Compound VI-a in 50 mL of THF is dropped in accordance with the advancement of reaction. After dropping, the reaction mixture is refluxed while agitated until the magnesium disappears, and then cooled to 40° C. To the resulting solution, 30 mL of DMF, which is dried with calcium hydride in advance, is dropped over 10 minutes. The resulting mixture is agitated magnetically at 50° C. for 30 minutes. After reaction, the mixture is cooled to 5° C. and put in a 1 L beaker with 400 mL of 10% hydrochloric acid and 300 mL of toluene. After they are agitated at 25° C. for 30 minutes magnetically, the toluene phase is separated, washed three times with 300 mL of pure water, dried with anhydrous sodium sulfate, and is subjected to filtration and distillation under a reduced pressure for removing the solvent to obtain 94 g of a red color oily product. The product is subjected to vacuum distillation (under a pressure of 1 to 3 mmHg, at a temperature of 140 to 150° C.) to obtain 52 g (yield: 64%) of a yellow color oily product (Compound VI-b), which is identified to be the objective compound with $^1$H-NMR and IR.

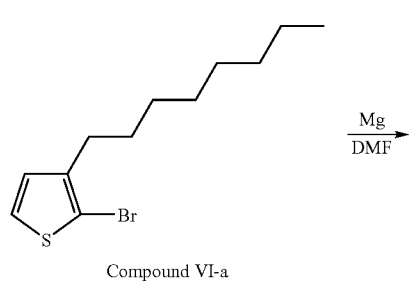

Compound VI-a

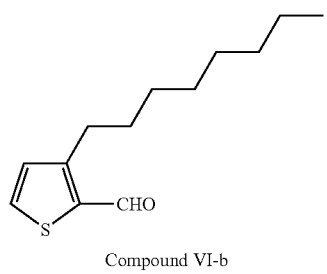

Compound VI-b

<Synthesis of Compound VI-c>

In a 300 mL four-necked flask, 8.0 g (67 mmol) of rubeanic acid and 60 g (267 mmol) of Compound VI-b are added, and dissolved in 60 mL of dimethylformamide. The mixture is agitated at 150° C. for 4 hours magnetically, and then cooled to 25° C. The resulting reaction liquid is added to 300 mL of pure water in a 1 L beaker and further agitated magnetically at 25° C. for 30 minutes. Further, 300 mL of toluene are added to the reaction mixture, which is further agitated for 10 minutes magnetically, and then the resulting toluene phase is separated, washed three times with 300 mL of pure water, dried with anhydrous sodium sulfate, and is subjected to filtration and distillation under a reduced pressure for removing the solvent to obtain a brown color oily product. To the product, 200 mL of methanol is added so as to remove the remaining source chemicals by decantation. To the resultant residue, 200 mL of hexane are added, and the resulting liquid is cooled to 5° C. for crystallization. The resulting crystals are separated by suction filtration and washed with 100 mL of methanol to obtain 12 g (yield: 38%) of orange color crystals (Compound VI-c) are obtained, which are identified to be the objective compound with $^1$H-NMR and IR.

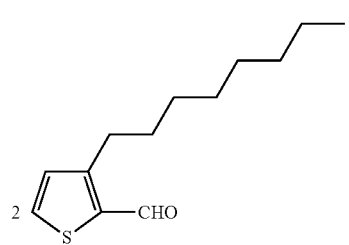

2 Compound VI-b

+

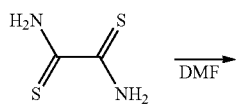

DMF→

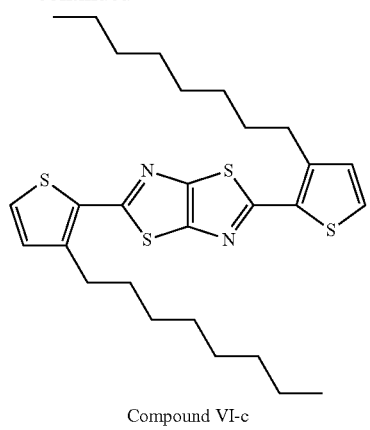

Compound VI-c

<Synthesis of Compound VI-d>

Under a nitrogen gas atmosphere, 12 g (23 mmol) of Compound VI-c and 8.9 g (50 mmol) NBS are added in a 500 mL three-necked flask and are dissolved in 200 mL of DMF. The resulting solution is agitated magnetically at 40° C. for 1 hour to complete reaction. After cooled to 25° C., the reaction solution is added to 500 mL of pure water in a 2 L beaker and agitated magnetically at 5° C. for 30 minutes. After agitation, the precipitated crystals are separated by suction filtration, washed with 1 L of pure water, further washed with 100 mL of methanol, and vacuum dried at 60° C. for 15 hours to obtain 12.2 g (yield: 76%) of orange color crystals (Compound VI-d), which are identified to be the objective compound with $^1$H-NMR and IR.

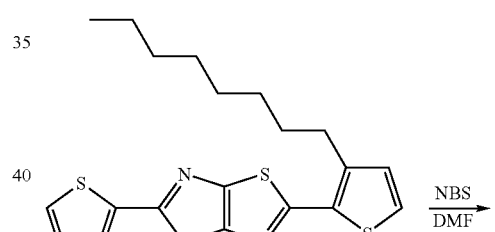

Compound VI-c

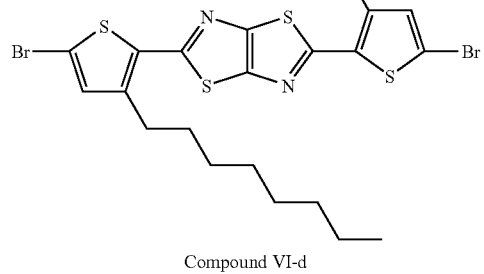

Compound VI-d

Synthesis of Exemplary Compound 25

Under a nitrogen gas atmosphere, 0.10 g (0.090 mmol) of tetrakis triphenylphosphine palladium (0) is dissolved in 60 mL of THF in a 200 mL three-necked flask. To the resulting solution, 2.06 g (3.0 mmol) of Compound IV-d, 7.0 mL of a 2M sodium carbonate aqueous solution, and 1.18 g (6.6 mmol) of 4-n-butylphenyl boronic acid are added in this order, and the resulting reaction liquid is refluxed for 8 hours while agitated magnetically. After the completion of the reaction is confirmed by $^1$H-NMR, the reaction liquid is cooled to 25° C. and transferred to a 1 L beaker with 80 mL of a 5% hydrochloric acid aqueous solution and 200 mL of toluene, and agitated magnetically at 25° C. for 30 minutes. The toluene phase is separated, washed three times with 200 mL of pure water, dried with anhydrous sodium sulfate, and is subjected to filtration and distillation under a reduced pressure for removing the solvent to obtain 2.8 g of a red color oily product. After palladium is removed by filtration with a silica gel column, the resulting product is washed with 50 mL of methanol and 20 mL of hexane, and then recrystallized with 100 mL of hexane. The resulting crystals are vacuum-dried for 15 hours to obtain 1.8 g (yield: 78%) of orange color crystals of Exemplary Compound 25, which are identified to be the objective compound by $^1$H-NMR and IR.

Example 7

Synthesis of Exemplary Compound 27

Under a nitrogen gas atmosphere, 0.090 g (0.080 mmol) of tetrakis triphenylphosphine palladium (0) is dissolved in 50 mL of THF in a 200 mL three-necked flask. To the resulting solution, 1.72 g (2.5 mmol) of Compound IV-d, 6.0 mL of a 2M sodium carbonate aqueous solution, and 1.23 g (5.3 mmol) of Compound V-a are added in this order, and the resulting reaction liquid is refluxed for 11 hours while agitated magnetically. After the completion of the reaction is confirmed by $^1$H-NMR, the reaction liquid is cooled to 25° C. and transferred to a 1 L beaker with 100 mL of a 5% hydrochloric acid aqueous solution and 200 mL of toluene and agitated magnetically at 25° C. for 30 minutes. The toluene phase is separated, washed three times with 200 mL of pure water, dried with anhydrous sodium sulfate, and is subjected to filtration and distillation under a reduced pressure for removing the solvent to obtain 2.8 g of a red color solid product. The product is purified with a silica gel column using

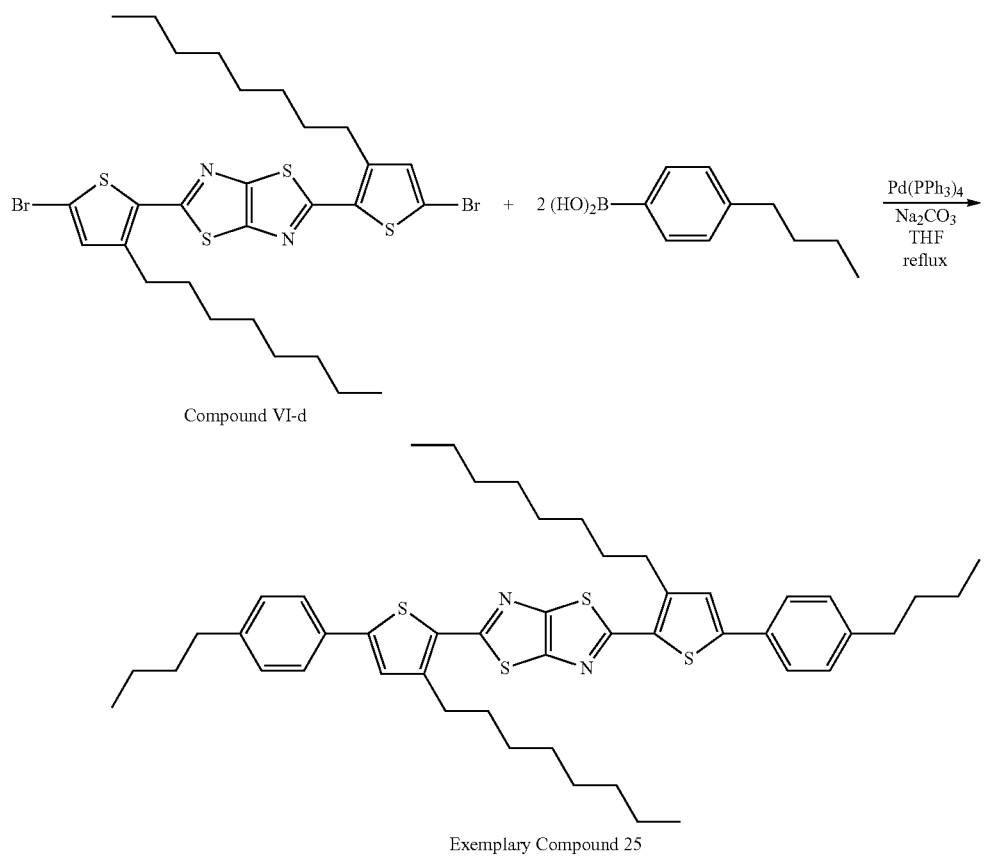

Compound VI-d

Exemplary Compound 25

<Production and Evaluation of Organic Semiconductor Transistor>

An organic semiconductor transistor is produced and evaluated substantially similarly to Example 1, except thatExemplary Compound 25 is used in place of Exemplary Compound 1.

a mixed solvent of toluene and hexane (mixing mass ratio: 1:5), recrystallized with a mixed solvent of ethanol and hexane (mixing mass ratio: 1:1), and vacuum-dried for 15 hours to obtain 0.7 g (yield: 30%) of orange color crystals of Exemplary Compound 27, which are identified to be the objective compound by $^1$H-NMR and IR.

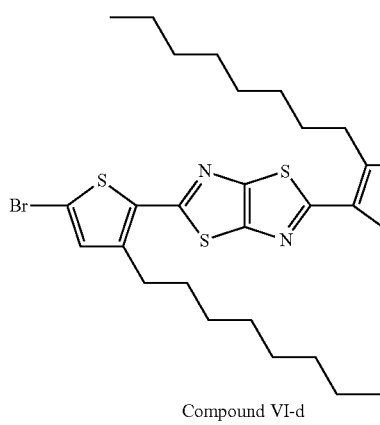

Compound VI-d + Compound V-a → (Pd(PPh₃)₄, Na₂CO₃, THF, reflux)

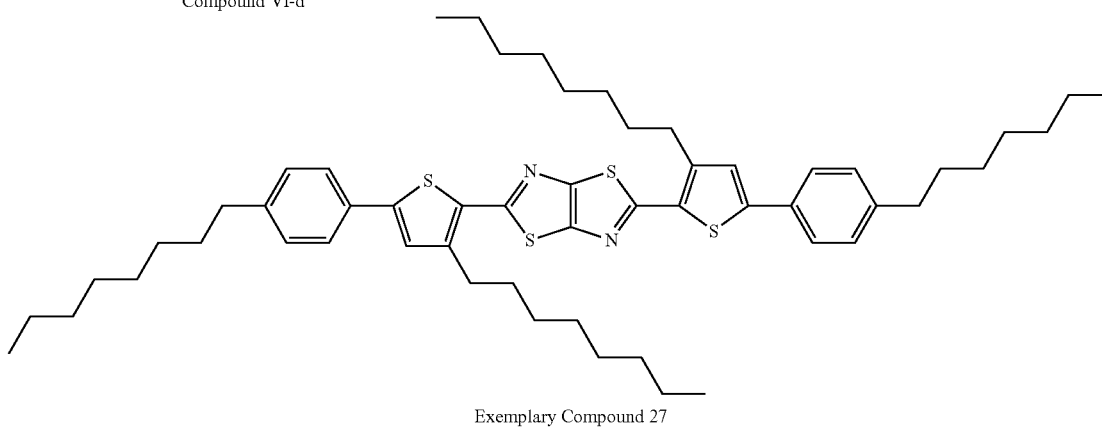

Exemplary Compound 27

<Production and Evaluation of Organic Semiconductor Transistor>

An organic semiconductor transistor is produced and evaluated substantially similarly to Example 1, except that Exemplary Compound 27 is used in place of the Exemplary Compound 1.

Example 8

Synthesis of Exemplary Compound 28

Under a nitrogen gas atmosphere, 0.090 g (0.080 mmol) of tetrakis triphenylphosphine palladium (0) is dissolved in 50 mL of THF in a 200 mL three-necked flask. To the resulting solution, 1.72 g (2.5 mmol) of Compound IV-d, 6.0 mL of a 2M sodium carbonate aqueous solution, and 1.52 g (5.3 mmol) of Compound V-b are added in this order, and the resulting reaction liquid is refluxed for 12 hours while agitated magnetically. After the completion of the reaction is confirmed by $^1$H-NMR, the reaction liquid is cooled to 25° C. and transferred to a 1 L beaker with 100 mL of a 5% hydrochloric acid aqueous solution and 200 mL of toluene and agitated magnetically at 25° C. for 30 minutes. The toluene phase is separated, washed three times with 200 mL of pure water, dried with anhydrous sodium sulfate, and is subjected to filtration and distillation under a reduced pressure for removing the solvent to obtain 3.1 g of an orange color solid product. The product is purified with a silica gel column using a mixed solvent of toluene and hexane, recrystallized with a mixed solvent of ethanol and hexane, and vacuum-dried for 15 hours to obtain 1.2 g (yield: 47%) of orange color crystals of Exemplary Compound 28, which are identified to be the objective compound by $^1$H-NMR and IR.

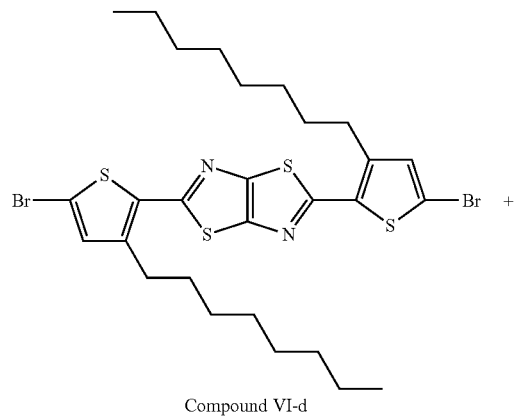

Compound VI-d +

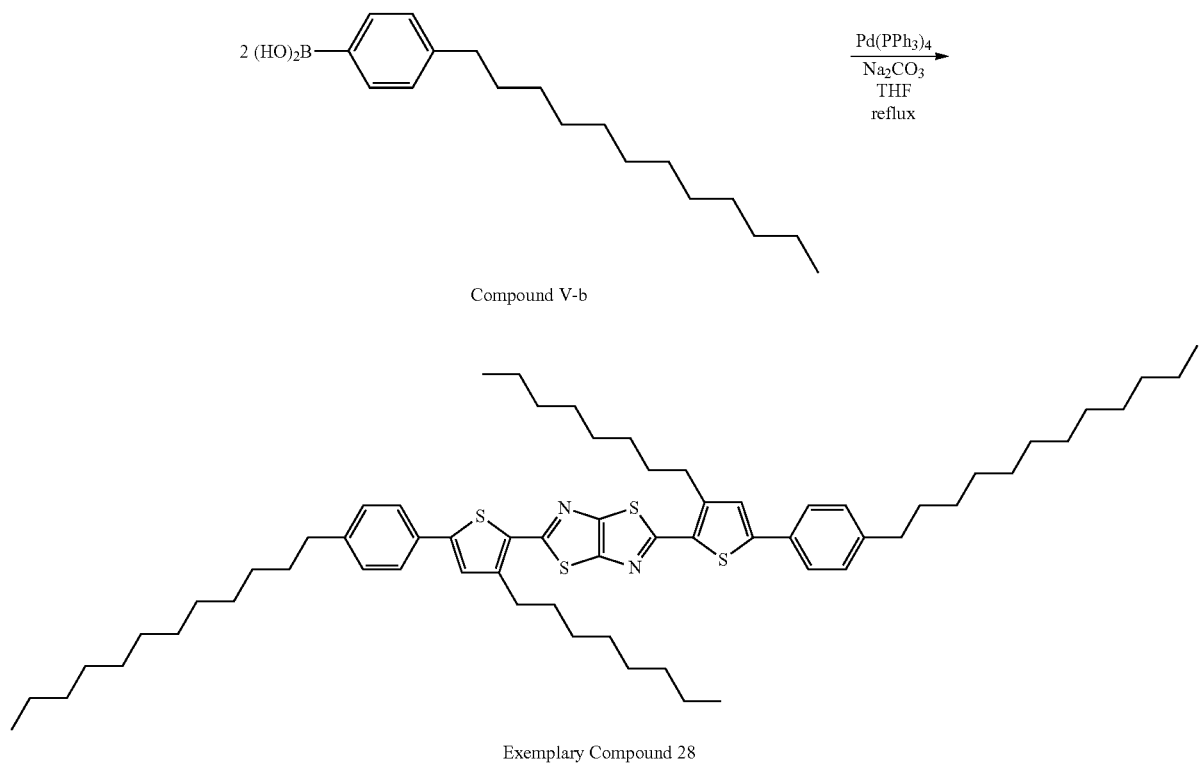

Compound V-b

Exemplary Compound 28

<Production and Evaluation of Organic Semiconductor>

An organic semiconductor transistor is produced and evaluated substantially similarly to Example 1, except that Exemplary Compound 28 is used in place of Exemplary Compound 1.

Example 9

Synthesis of Exemplary Compound 8

Under a nitrogen gas atmosphere, 0.090 g (0.080 mmol) of tetrakis triphenylphosphine palladium (0) is dissolved in 50 mL of THF in a 200 mL three-necked flask. To the resulting solution, 1.23 g (2.5 mmol) of Compound IV-b, 6.0 mL of a 2M sodium carbonate aqueous solution, and 1.24 g (5.3 mmol) of Compound IV-a are added in this order, and the resulting reaction liquid is refluxed for 12 hours while agitated magnetically. After the completion of the reaction is confirmed by $^1$H-NMR, the reaction liquid is cooled to 25° C. and transferred to a 1 L beaker with 100 mL of a 5% hydrochloric acid aqueous solution and 200 mL of toluene and agitated magnetically at 25° C. for 30 minutes. The toluene phase is separated, washed three times with 200 mL of pure water, dried with anhydrous sodium sulfate, and is subjected to filtration and distillation under a reduced pressure for removing the solvent to obtain 1.7 g of an orange color solid product. The product is purified with a silica gel column using a mixed solvent of toluene and THF (mixing mass ratio: 1:2), recrystallized with toluene, and vacuum-dried for 15 hours to obtain 1.2 g (yield: 70%) of orange color crystals of Exemplary Compound 8, which are identified to be the objective compound by $^1$H-NMR and IR.

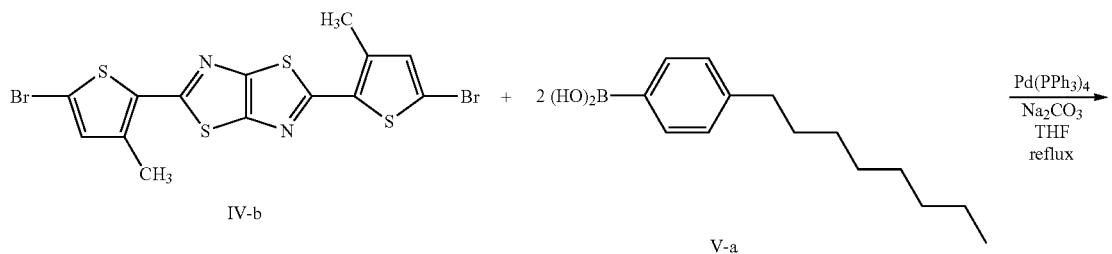

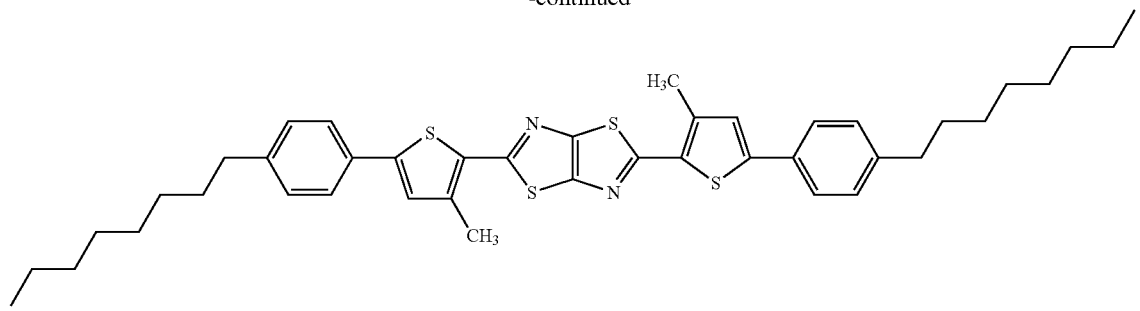

Exemplary Compound 8

<Production and Evaluation of Organic Semiconductor Transistor>

An organic semiconductor transistor is produced and evaluated substantially similarly to Example 1, except that Exemplary Compound 8 is used in place of Exemplary Compound 1.

Comparative Example 1

An organic semiconductor transistor is produced and evaluated substantially similarly to Example 1, except that 13,6-N-sulfinylacetoamide pentacene (manufactured by Aldrich Corp.) is used in place of Exemplary Compound 1 and that the heating temperature is changed to 160° C.

Comparative Example 2

An organic semiconductor transistor is produced and evaluated substantially similarly to Comparative Example 1, except that poly(3-hexylthiophene) (manufactured by Aldrich Corp.) is used in place of 13,6-N-sulfinylacetoamide pentacene used in Comparative Example 2 and that the solvent is changed to chloroform.

Comparative Example 3

An organic semiconductor transistor is produced and evaluated substantially similarly to Example 1, except that the thiazolothiazole derivative represented by Chemical Formula 3 is used in place of Exemplary Compound 1.

Evaluation results for the organic semiconductor transistors that are produced in Examples and Comparative Examples are shown in Table 1.

TABLE 1

| | Charge mobility ($cm^2/Vs$) | | Film formability | |
|---|---|---|---|---|
| | Immediately after Producing | One month after Producing | Toluene | Tetrahydrofuran |
| Example 1 | $5.4 \times 10^{-5}$ | $4.8 \times 10^{-5}$ | B | A |
| Example 2 | $2.0 \times 10^{-4}$ | $1.5 \times 10^{-4}$ | B | A |
| Example 3 | $5.6 \times 10^{-6}$ | $4.2 \times 10^{-6}$ | A | A |
| Example 4 | $3.3 \times 10^{-5}$ | $3.0 \times 10^{-5}$ | B | A |
| Example 5 | $4.1 \times 10^{-5}$ | $3.1 \times 10^{-5}$ | B | A |
| Example 6 | $3.8 \times 10^{-6}$ | $3.3 \times 10^{-6}$ | A | A |
| Example 7 | $1.1 \times 10^{-6}$ | $9.5 \times 10^{-7}$ | A | A |
| Example 8 | $2.2 \times 10^{-5}$ | $1.5 \times 10^{-5}$ | A | A |
| Example 9 | $4.6 \times 10^{-4}$ | $7.0 \times 10^{-5}$ | A | A |
| Comparative Example 1 | $7.5 \times 10^{-5}$ | Unmeasurable | B | A |
| Comparative Example 2 | $3.5 \times 10^{-5}$ | $9.3 \times 10^{-7}$ | B | A |
| Comparative Example 3 | No film is formable | No film is formable | C | C |

Table 1 shows that the organic semiconductor transistor of each example, as compared with the organic transistors of the comparative examples, has a high charge mobility immediately after producing and exhibits a stable charge mobility even one month later passes over after producing.

Further, Table 1 shows that the organic semiconductor layer of each example, as compared with the organic semiconductor layers of the comparative examples, has excellent film formability and is prevented from having failures such as cracks.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An organic semiconductor transistor, comprising:
    plural electrodes, and
    an organic semiconductor layer comprising at least one compound represented by the following Formula (I):

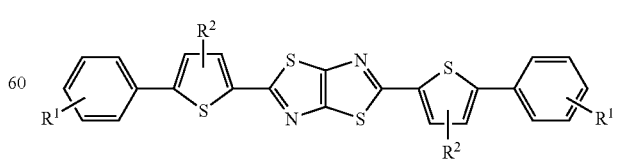

(I)

wherein, in Formula (I), each $R^1$ independently represents a straight-chain alkyl group having from 3 to 20 carbon atoms, a straight-chain alkoxy group having from 3 to 20 carbon atoms, a branched alkyl group having from 3 to 20 carbon atoms, or a branched alkoxy group having from 3 to 20 carbon atom; and each $R^2$ independently represents a hydrogen atom, a straight-chain alkyl group having from 1 to 20 carbon atoms, a straight-chain alkoxy group having from 1 to 20 carbon atoms, a branched alkyl group having from 3 to 20 carbon atoms, or a branched alkoxy group having from 3 to 20 carbon atoms.

2. The organic semiconductor transistor according to claim 1, wherein:
   each $R^1$ in Formula (I) independently represents a straight-chain substitution group having from 3 to 12 carbon atoms or a branched substitution group with a main chain having from 3 to 12 carbon atoms; and
   each $R^2$ independently represents a straight-chain substitution group having from 1 to 12 carbon atoms or a branched substitution group with a main chain having from 2 to 12 carbon atoms.

3. The organic semiconductor transistor according to claim 1, wherein each $R^1$ in Formula (I) independently represents a straight-chain alkyl group having from 3 to 12 carbon atoms, a straight-chain alkoxy group having from 3 to 12 carbon atoms, a branched alkyl group having from 3 to 12 carbon atoms, or a branched alkoxy group having from 3 to 12 carbon atoms.

4. The organic semiconductor transistor according to claim 1, wherein each $R^2$ in Formula (I) independently represents a hydrogen atom, a straight-chain alkyl group having from 1 to 8 carbon atoms, a straight-chain alkoxy group having from 1 to 8 carbon atoms, a branched alkyl group having from 3 to 8 carbon atoms, or a branched alkoxy group having from 3 to 8 carbon atoms.

5. The organic semiconductor transistor according to claim 1, wherein each $R^2$ in Formula (I) independently represents a straight-chain alkyl group having from 1 to 8 carbon atoms, a straight-chain alkoxy group having from 1 to 8 carbon atoms, a branched alkyl group having from 3 to 8 carbon atoms, or a branched alkoxy group having from 3 to 8 carbon atoms.

6. The organic semiconductor transistor according to claim 1, wherein each $R^2$ in Formula (I) independently represents a straight-chain alkyl group having from 3 to 8 carbon atoms, a straight-chain alkoxy group having from 3 to 8 carbon atoms, a branched alkyl group having from 3 to 8 carbon atoms, or a branched alkoxy group having from 3 to 8 carbon atoms.

7. The organic semiconductor transistor according to claim 1, wherein the linking position of $R^1$ on a phenyl group in Formula (I) is position-3.

8. The organic semiconductor transistor according to claim 1, wherein the linking position of $R^1$ on to a phenyl group in Formula (I) is position-4.

9. The organic semiconductor transistor according to claim 1, wherein the thickness of the organic semiconductor layer is from about 1 nm to about 100 μm.

10. The organic semiconductor transistor according to claim 1, wherein the thickness of the organic semiconductor layer is from about 5 nm to about 10 μm.

11. The organic semiconductor transistor according to claim 1, wherein the organic semiconductor layer is doped with a donor dopant.

12. The organic semiconductor transistor according to claim 11, wherein the donor dopant is selected from the group consisting of: an alkali metal selected from Li, Na, K, Rb, or Cs; an alkaline earth metal selected from Ca, Sr, or Ba; a rare earth metal selected from Y, La, Ce, Pr, Nd, Sm, Eu, Gd, Tb, Dy, Ho, Er, or Yb; and an ammonium ion.

13. The organic semiconductor transistor according to claim 1, wherein the organic semiconductor layer is doped with an acceptor dopant.

14. The organic semiconductor transistor according to claim 13, wherein the acceptor dopant is selected from the group consisting of: a halogen compound selected from $Cl_2$, $Br_2$, $I_2$, ICl, $ICl_3$ or IBr; a Lewis acid selected from $PF_5$, $AsF_5$, $SbF_5$, $BF_3$ or $SO_3$; a protonic acid selected from HF, HCl, $HNO_3$ or $H_2SO_4$; an organic acid selected from acetic acid, formic acid or amino acid; a transition metal compound selected from $FeCl_3$, $TiCl_4$, or $HfCl_4$; an electrolyte anion selected from $Cl^-$, $Br^-$, $I^-$, $ClO4^-$ or a sulfonic acid anion; and an organic compound selected from tetracyanoethylene, 7,7,8,8-tetracyanoquinodimethane, 11,11,12,12-tetracyanonaphto-2,6-quinodimethane, 2,5-difluoro-7,7,8,8-tetracyanoquinodimethane, or tetrafluorotetracyanoquinodimethane.

15. The organic semiconductor transistor according to claim 1, wherein the plural electrodes comprise a source electrode, a drain electrode and a gate electrode;
   the organic semiconductor transistor further comprises an insulation layer;
   the gate electrode is provided far from both of the source electrode and the drain electrode;
   the organic semiconductor layer is provided in contact with both of the source electrode and the drain electrode;
   the insulation layer is provided between the organic semiconductor layer and the gate electrode; and
   the organic semiconductor transistor is a field effect transistor.

16. The organic semiconductor transistor according to claim 15, further comprising a protective layer.

17. The organic semiconductor transistor according to claim 16, wherein the protective layer comprises a material selected from a metal selected from In, Sn, Pb, Au, Cu, Ag or Al; a metal oxide selected from MgO, $SiO_2$ or $TiO_2$; or a resin selected from polyethylene resin, polyurea resin or polyimide resin.

18. A method of producing the organic semiconductor transistor according to claim 1, in a wet process.

19. The method of producing the organic semiconductor transistor according to claim 18, the method comprising a process selected from spin coating, casting, dip coating, die coating, roll coating, bar coating, or ink-jet coating.

20. An electronic device comprising the organic semiconductor transistor according to claim 1.

* * * * *